(12) United States Patent
Majima et al.

(10) Patent No.: US 10,170,547 B2
(45) Date of Patent: Jan. 1, 2019

(54) NANODEVICE

(71) Applicant: JAPAN SCIENCE AND TECHNOLOGY AGENCY, Kawaguchi-shi, Saitama (JP)

(72) Inventors: Yutaka Majima, Yokohama (JP); Toshiharu Teranishi, Uji (JP); Shinya Kano, Yokohama (JP); Eiki Aoyama, Yokohama (JP)

(73) Assignee: JAPAN SCIENCE AND TECHNOLOGY AGENCY, Kawaguchi-shi (JP)

( * ) Notice: Subject to any disclaimer, the term of this patent is extended or adjusted under 35 U.S.C. 154(b) by 0 days.

(21) Appl. No.: 15/507,530

(22) PCT Filed: Aug. 25, 2015

(86) PCT No.: PCT/JP2015/073917
§ 371 (c)(1),
(2) Date: Feb. 28, 2017

(87) PCT Pub. No.: WO2016/031836
PCT Pub. Date: Mar. 3, 2016

(65) Prior Publication Data
US 2017/0288017 A1 Oct. 5, 2017

(30) Foreign Application Priority Data
Aug. 29, 2014 (JP) .................. 2014-176634

(51) Int. Cl.
*H01L 29/66* (2006.01)
*H01L 29/06* (2006.01)
(Continued)

(52) U.S. Cl.
CPC .......... *H01L 29/0665* (2013.01); *B82Y 30/00* (2013.01); *G06N 99/002* (2013.01);
(Continued)

(58) Field of Classification Search
CPC .......... H01L 29/0665; H01L 29/66439; H01L 29/66469; H01L 29/66977; H01L 29/775;
(Continued)

(56) References Cited

U.S. PATENT DOCUMENTS 5,886,380 A * 3/1999 Nakajima .............. B82Y 10/00
257/24
7,465,953 B1 12/2008 Koh et al.
(Continued)

FOREIGN PATENT DOCUMENTS

CN 100468748 C * 3/2009
JP 2005-175224 A 6/2005
(Continued)

OTHER PUBLICATIONS

Han et al., Silicon based single electronic memory device with side grid structure and production method thereof, 2009, machine translation of CN 100468748 by google on Nov. 1, 2017, pp. 1-12.*
(Continued)

*Primary Examiner* — Natalia Gondarenko
(74) *Attorney, Agent, or Firm* — Westerman, Hattori, Daniels & Adrian, LLP

(57) ABSTRACT

A nanodevice capable of controlling the state of electric charge of a metal nanoparticle is provided. The device includes: nanogap electrodes 5 including one electrode 5A and the other electrode 5B disposed so as to have a nanosize gap in between; a nanoparticle 7 placed between the nanogap electrodes 5; and a plurality of gate electrodes 9. At least one of the plurality of gate electrodes 9 is used as a floating gate electrode to control the state of electric charge of the nanoparticle 7, which achieves a multivalued memory and rewritable logical operation.

6 Claims, 27 Drawing Sheets

(51) Int. Cl.

| | |
|---|---|
| H01L 29/788 | (2006.01) |
| H01L 29/40 | (2006.01) |
| B82Y 30/00 | (2011.01) |
| H01L 29/786 | (2006.01) |
| H01L 29/792 | (2006.01) |
| H01L 27/115 | (2017.01) |
| H01L 29/78 | (2006.01) |
| G06N 99/00 | (2010.01) |
| H01L 49/00 | (2006.01) |
| H01L 49/02 | (2006.01) |
| H01L 29/41 | (2006.01) |
| H01L 23/58 | (2006.01) |
| B82Y 15/00 | (2011.01) |
| B82Y 40/00 | (2011.01) |

(52) U.S. Cl.
CPC ............ *H01L 27/115* (2013.01); *H01L 28/00* (2013.01); *H01L 29/786* (2013.01); *H01L 29/788* (2013.01); *H01L 29/7831* (2013.01); *H01L 29/792* (2013.01); *H01L 49/006* (2013.01); *B82Y 15/00* (2013.01)

(58) Field of Classification Search
CPC . H01L 29/788; H01L 29/7831; H01L 49/006; B82Y 15/00
USPC ............ 257/9, 213, 329, E21.404, 553, 499; 438/142, 197, 299, 268
See application file for complete search history.

(56) References Cited

U.S. PATENT DOCUMENTS

2002/0096740 A1* 7/2002 Uchida .................. B82Y 10/00
257/553
2004/0155253 A1* 8/2004 Chae ..................... B82Y 10/00
257/90
2015/0014624 A1 1/2015 Majima et al.

FOREIGN PATENT DOCUMENTS

| | | |
|---|---|---|
| WO | 2012/121067 A1 | 9/2012 |
| WO | 2013/129535 A1 | 9/2013 |

OTHER PUBLICATIONS

Teranishi et al., Heat-Induced Size Evolution of Gold Nanoparticles in the Solid State, Advanced Materials, 2001, 13, No. 22, Nov. 16, pp. 1699-1671 (3 pages).
Fujii et al., Carbon Nanotube-Based Floating Gate Memories with High-k Dielectrics, Japanese Journal of Applied Physics 51 (2012) 06FD11 (4 pages).
Maeda et al., Logic Operations of Chemically Assembled Single-Electron Transistor, ACS Nano, vol. 6, No. 3 (2012), pp. 2798-2803 (6 pages).
Okabayashi et al., Uniform charging energy of single-electron transistors by using size-controlled Au nanoparticles, Applied Physics Letters 100, 033101 (2012) (4 pages, including cover page).
Serdio V. et al., Robust nanogap electrodes by self-terminating electroless gold plating, Nanoscale, Apr. 2012, pp. 7161-7167 (7 pages).
Azuma et al., Floating Gate Memory Effect in Nanoparticle Single-electron Transistor, Program Brochure for the 75th Japan Society of Applied Physics Autumn Meeting (2014), p. 09-072 (4 pages, including cover and description pages) (only abstract in Japanese).
International Search Report dated Nov. 24, 2015, issued in counterpart International Application No. PCT/JP2015/073917 (2 pages).

* cited by examiner

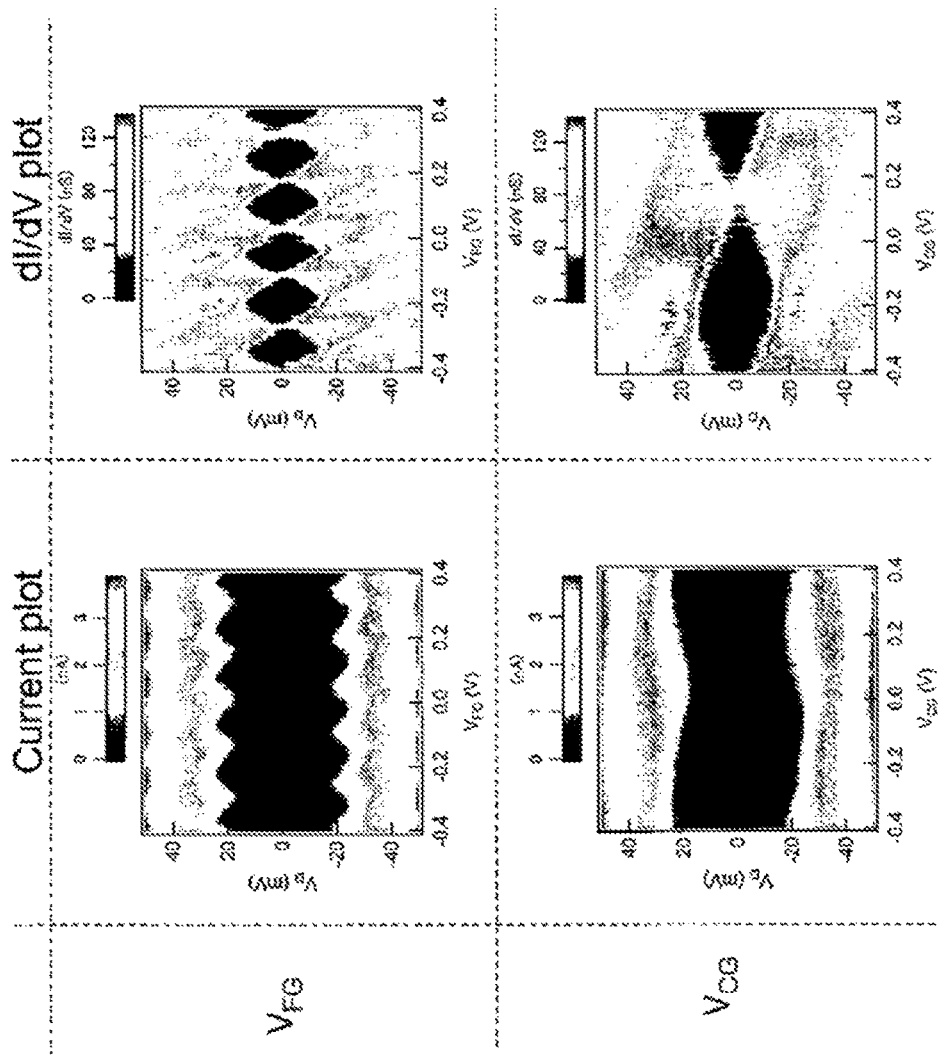

NANODEVICE

TECHNICAL FIELD

The present invention relates to a nanodevice in which a nanoparticle is disposed between nanogap electrodes, and the charged state of the nanoparticle is controlled.

BACKGROUND ART

A device in which a pair of electrodes is made to face each other so that they have a nanogap in between and a nanoparticle or molecule is placed in the nanogap is regarded as promising as a new device because of its switching and memory functions. The inventor et al. aim to fabricate a single electron transistor (SET) by introducing a chemically synthesized gold nanoparticle into nanogap electrodes produced by electroless gold plating, and establish an SET integrated circuit that is activated at normal temperatures (Non-Patent Literature 1). The inventor et al. have also succeeded in producing nanogap electrodes having a gap length of 5 nm or shorter at the yield of 90% (Non-patent Literature 2), and furthermore, developed "molecular ruler electroless gold plating: MoRELGP" process using a surfactant molecule as a template, and established a technology to produce nanogap electrodes having a gap length of 2 nm with a high degree of reproducibility (Patent Literature 1 and Non-Patent Literature 3).

Meanwhile, Non-Patent Literature 4 describes the operation of a single-electron memory in a transistor having a structure where a poly Si ultrathin film thin wire and a gate electrode cross each other via an oxidized film. The poly Si has a structure where crystalline particles of a sire of several nm are placed closely to one another, and when gate voltage is applied poly Si crystalline particles are filled with electrons, and a percolation path is established, allowing current to flow between a source and a drain. Furthermore, when a high voltage is applied as a gate voltage, electrons are captured into accumulated dots, and due to Coulomb repulsion among electrons, conductance of the current path changes, generating memory effect.

Non-Patent Literature 5 discloses a technology to cover a carbon nanotube with a SiN film, provide an Au dot and a blocking layer $Al_2O_3$, use the Au dot as a charge accumulation node, and provide a top gate on the node.

CITATION LIST

Patent Literature

Patent Literature 1: International Publication 2012/121067

Non-Patent Literature

Non-Patent Literature 1: K. Maeda, Y. Majima et al., ACS Nano, 6, 2798 (2012)
Non-Patent Literature 2: Victor M. Serdio V., Yutaka Majima et al., Nanoscale, 4, 7161 (2012)
Non-Patent Literature 3: N. Okabayashi, Yutaka Majima et al., Appl. Phys. Lett., 100, 033101 (2012)
Non-Patent Literature 4: K. Uchida et al., IEEE Trans Electron Dev., 41, 1628 (1994)
Non-Patent Literature 5: Y. Fujii et al., Jpn. J. Appl. Phys., 51, 06FD11 (2012)
Non-Patent Literature 6: T. Teranishi et al., Adv. Mater. 13, 1699 (2001)

SUMMARY OF INVENTION

Technical Problem

However, it is difficult to control the state of electric charge of metal nanoparticles with a single device, and it is also difficult to allow the state of electric charge induced by metal nanoparticles to change by approximately half of the elementary charge.

In view of the above problem, a purpose of the present invention is to provide a nanodevice capable of controlling the state of electric charge of nanoparticles.

Solution to Problem

To solve the problem, the present invention takes the following measures:

[1] A nanodevice including nanogap electrodes including one electrode and the other electrode so as to have a nanosize gap in between; a nanoparticle disposed between the nanogap electrodes; and a plurality of gate electrodes, wherein at least one of the plurality of gate electrodes is used as a floating gate electrode to control a state of electric charge of the nanoparticle.

[2] The nanodevice as set forth in [1] wherein a voltage to be applied to the floating gate falls within a range between a peak state and a bottom state of Coulomb oscillation.

[3] The nanodevice as set forth in [1], wherein as a result of the voltage to be applied to the floating gate being divided into a plurality of ranges, a current flowing between the one electrode and the other electrode is made to change in stages.

[4] The nanodevice as set forth in [3], wherein as the voltage to be applied to the floating gate, either Coulomb oscillation characteristics having a steep gradient or those having a gentle gradient are used.

[5] The nanodevice as set forth in [1], wherein a value is set as a potential difference corresponding to input of High and Low of voltage applied to the plurality of gate electrodes, the value corresponds to both ends of one of divisions of voltage difference $\Delta V$ between a gate voltage to provide a peak current in Coulomb oscillation for one cycle and a gate voltage to provide a next peak current, the voltage difference $\Delta V$ is equally divided into two, three, or four parts.

[6] The nanodevice as set forth in one of [1] to [5], wherein the plurality of gate electrodes include one or more side gate electrodes existing on a same plane as the nanogap electrodes.

[7] The nanodevice as set forth in one of [1] to [5], wherein the nanogap electrode and the nanoparticle are covered with an insulation layer; and the plurality of gate electrodes comprise a side gate electrode and a top gate electrode.

[8] The nanodevice as set forth in [1] further including: a control gate electrode at a position facing the nanoparticle via the floating gate electrode, wherein as a result of applying a voltage to the control gate electrode, a state of electric charge of the floating gate electrode is made to change, thereby controlling the state of electric charge of the nanoparticle.

[9] The nanodevice as set forth in [1], wherein the one electrode and the other electrode are disposed facing each other via the nanoparticle; a side gate electrode and the floating gate electrode as the plurality of gate electrode are disposed facing each other via the nanoparticle; and a control gate electrode is disposed so as to face the nanoparticle via the floating gate electrode.

[10] The nanodevice as set forth in [9], wherein the one electrode, the other electrode, the side gate electrode, the floating gate electrode, and the control gate electrode are disposed on a same plane.

Advantageous Effects of Invention

According to the present invention, since at least one of the plurality of gate electrodes is used as a floating gate electrode, the state of electric charge of the nanoparticle can be controlled arbitrarily, allowing a multivalued memory to be constituted with a single nanodevice, and a rewritable logical operator to be constituted with a single nanodevice. The present invention is expected to be applied to an energy-saving single-electron flash memory and a logical operator.

BRIEF DESCRIPTION OF DRAWINGS

FIG. 2 shows an embodiment of the nanodevice shown in FIG. 1, where

FIG. 3 shows an embodiment of a device different from the one shown in FIG. 2, where

FIG. 4 shows charts describing a case where a nanodevice according to an embodiment of the present invention is used as a multivalued memory, where

FIG. 8 shows a nanodevice according to an embodiment of the present invention, where

FIG. 11 is a chart showing Coulomb oscillation characteristics, where

FIG. 13A shows the dependency of drain current $I_{DS}$ (pA) on the voltage applied to the first side gate when the second side gate is made to be 0V, and (B) shows the dependency of drain current $I_{DS}$ (pA) on the voltage applied to the second side gate when the first side gate is made to be 0V.

FIG. 20 is a chart showing the mapping (stability diagram) of drain current $V_D$ (mV) and differential conductance of the nanodevice produced in Example 4 when the first side gate voltage $V_{FG}$ (V) and the second side gate voltage $V_{CG}$ (V) are swept respectively.

FIG. 21 is a chart showing Coulomb oscillation of the nanodevice produced in Example 4 when 2-input gate electrodes are swept independently, where

REFERENCE SIGNS LIST 10, 10A, 20: Nanodevice
1: Substrate (Semiconductor substrate)
2: First insulation layer (Insulation layer)
3A, 3B: Seed electrode (Initial electrode)
4A, 4B: Plating electrode 5: Nanogap electrode
5A: One electrode (Source electrode)
6: Self-Assembled Monolayer film
7: Metal nanoparticle (Gold nanoparticle)
8: Second insulation layer (Another insulation layer)
9: Gate electrode
9A: Side gate electrode
9B: Side gate electrode (Floating gate electrode)
9C: Top gate electrode
9D: Bottom gate electrode
11: Switch
12: Control gate electrode

DESCRIPTION OF EMBODIMENTS

An embodiment of the present invention will hereinafter be described specifically by referring to drawings.

Figure 1:
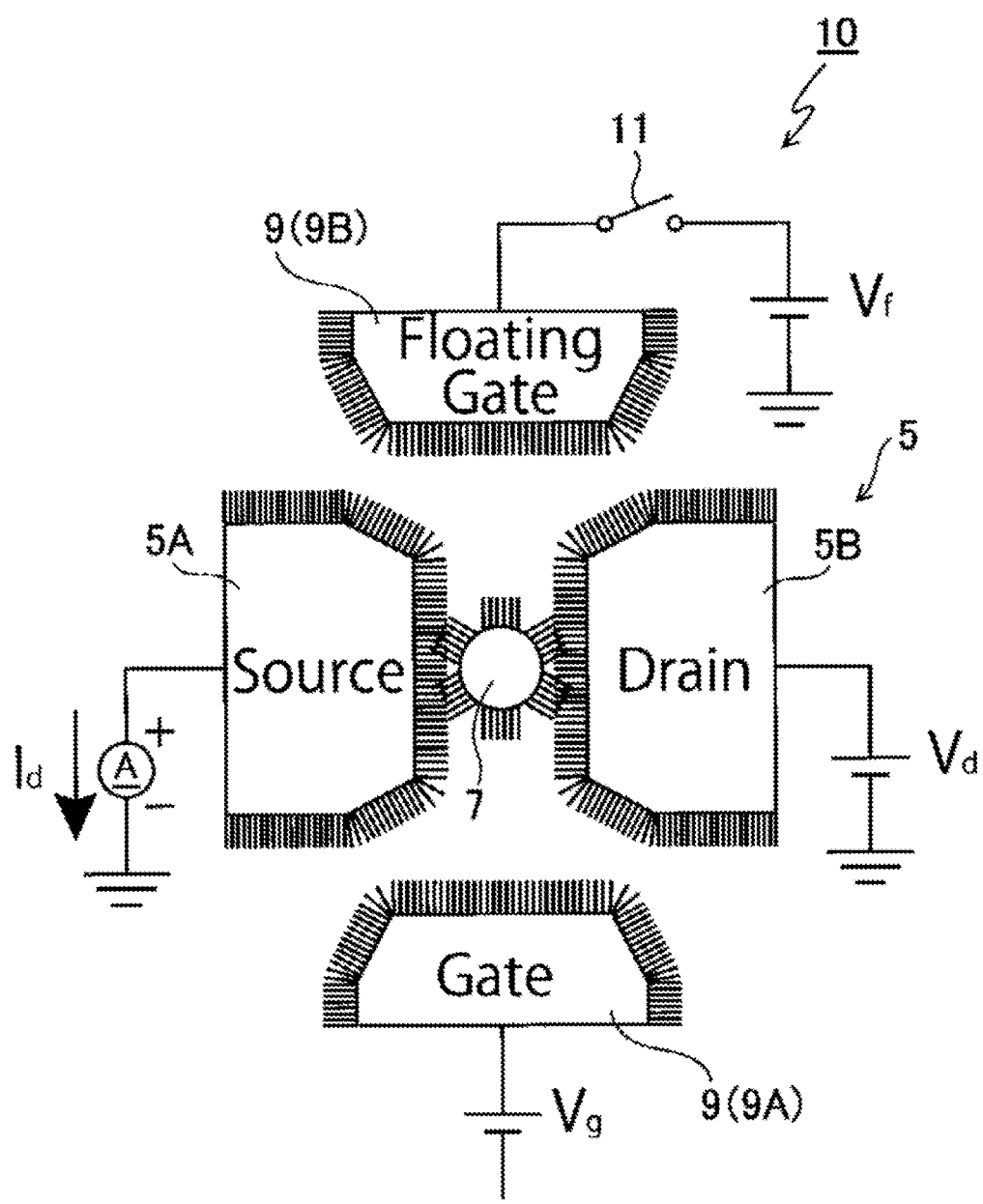
FIG. 1 is a drawing schematically showing the structure of a nanodevice according to an embodiment of the present invention.

FIG. 1 is a drawing schematically showing the structure of a nanodevice according to an embodiment of the present invention. Nanodevice 10 according to the embodiment of the present invention has nanogap electrodes 5 having one electrode 5A and the other electrode 5B disposed so that they have a nanogap in between, a metal particle 7 placed in the nanogap, and a plurality of gate electrodes 9, at least one of the plurality of gate electrodes 9 being made to function as a floating gate electrode 9B.

Figure 2A:
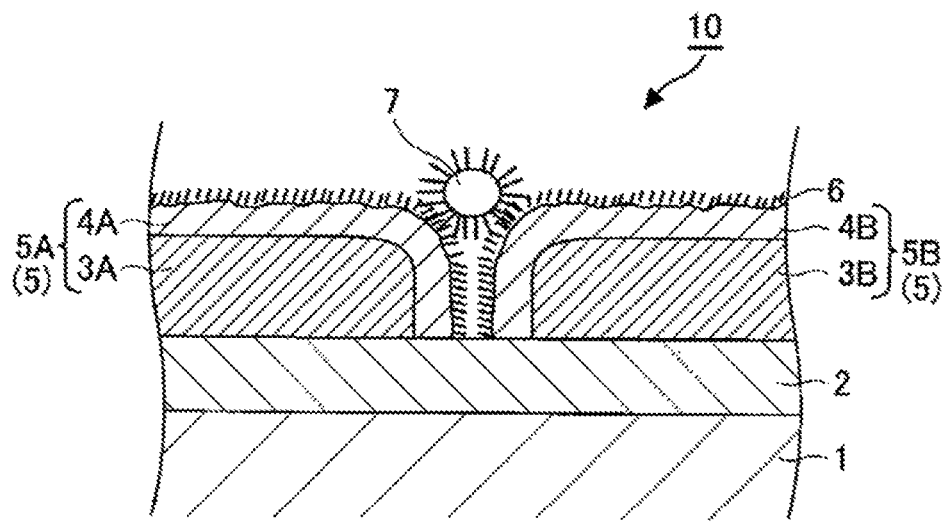
FIG. 2A is a cross-sectional view.
Figure 2B:
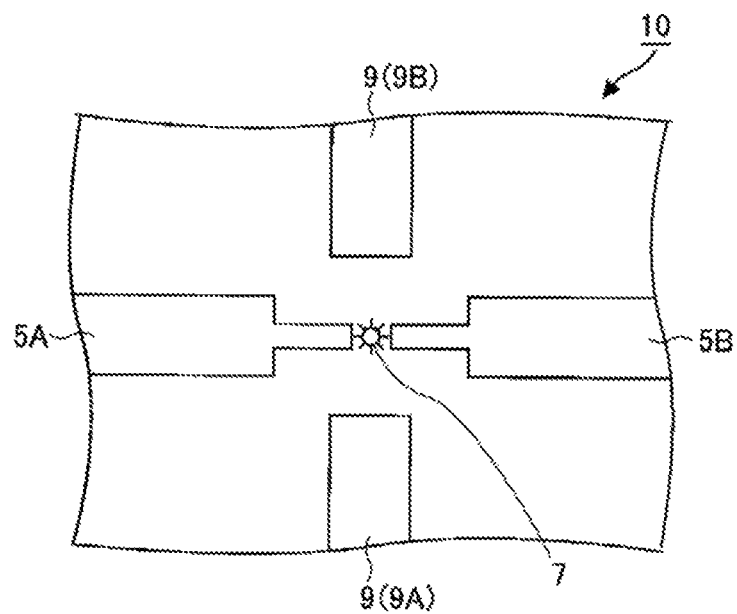
FIG. 2B is a plan view.

FIG. 2 shows an embodiment of the nanodevice shown in FIG. 1, where FIG. 2A is a cross-sectional view, and FIG. 2B is a plan view. Nanodevice 10 specifically has a substrate 1, an insulation layer 2, nanogap electrodes 5 formed on the insulation layer 2, a self-assembled monolayer film 6 formed on the nanogap electrodes 5, a metal nanoparticle 7 disposed in the nanogap via the self-assembled monolayer film 6, and a plurality of gate electrodes 9 (9A, 9B) formed on the insulation layer 2 so as to cross the array direction of the nanogap electrodes 5. Both of the plurality of gate electrodes 9 are side gate electrodes, one of the side gate electrodes 9B being made to function as a floating gate electrode. The nanogap electrodes 5 (5A, 5B) are made up of seed electrodes 3A, 3B having one or more layers and plating electrodes 4A, 4B.

To at least one side gate electrode 9A, of the plurality of gate electrodes 9, a wire is connected so that gate voltage can be applied. To the other side gate electrode 9B, one end of a switch 11 is connected as shown in FIG. 1, allowing floating voltage Vf to be applied to the floating electrode to ensure a certain electric potential.

Figure 3A:
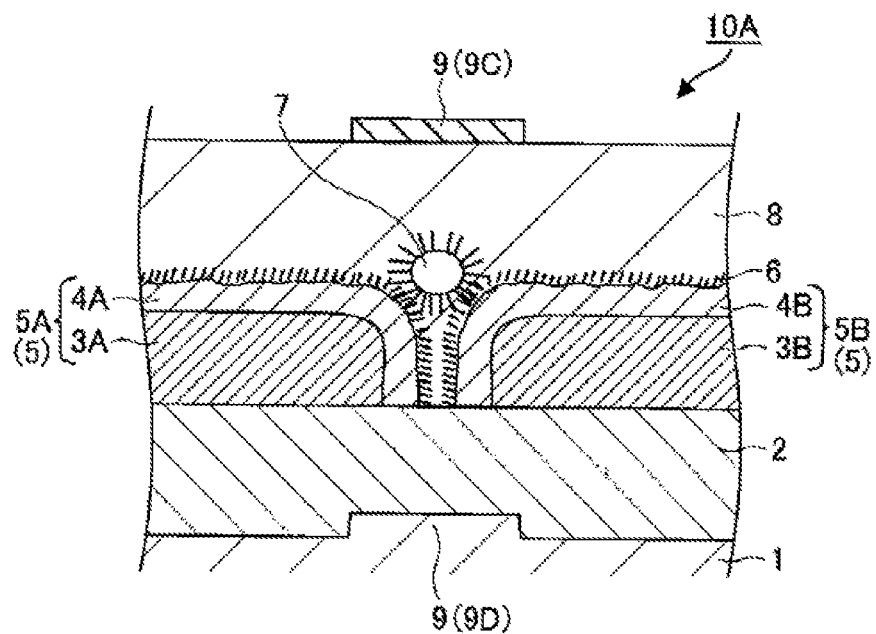
FIG. 3A is a cross-sectional view.
Figure 3B:
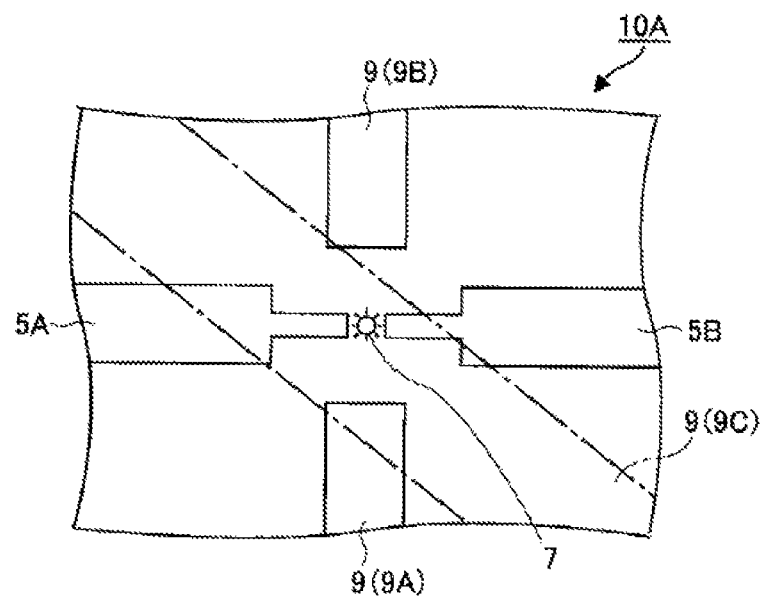
FIG. 3B is a plan view.

FIG. 3 shows an embodiment of a nanodevice different from the one shown in FIG. 2, where FIG. 3A is a cross-sectional view, and FIG. 3B is a plan view. Nanodevice 10A specifically includes a substrate 1, an insulation layer 2, nanogap electrodes 5 formed on the insulation layer 2, a self-assembled monolayer film 6 formed on the nanogap electrodes 5, a metal nanoparticle 7 disposed in the nanogap via the self-assembled monolayer film 6, and a plurality of gate electrodes 9. In the embodiment shown in FIG. 3, the plurality of gate electrodes 9 include side gate electrodes 9A, 9B, a top gate electrode 9C, and a bottom gate electrode 9D, unlike the embodiment shown in FIG. 2. The number of gate electrodes 9 is set by a combination of the side gate electrodes 9A, 9B disposed on the insulation layer 2 so as to cross the array direction of the nanogap electrodes and the top gate electrode 9C. The number of the side gate electrodes 9A, 9B and the top gate electrode 9C is set as required depending on the application of the nanodevice 10A.

With the nanodevice 10A shown in FIG. 3, a second insulation layer 8 is formed on the nanogap electrodes 5, metal nanoparticle 7, and side gate electrodes 9A, 9B, and on the second insulation layer 8, a top gate electrode 9C is formed. Also, a bottom gate electrode 9D is formed on the substrate 1, and electric potential can be applied by the substrate 1. With the nanodevice 10A shown in FIG. 3 also, at least one of the plurality of gate electrodes 9 is used as a floating gate electrode.

Wiring connection is made to at least one of the plurality of gate electrodes 9 so that gate voltage can be applied. To other gate electrodes, an end of a switch is connected, allowing floating voltage Vf to be applied to the floating electrode and ensuring a certain electric potential. The following description assumes the embodiment shown in FIG. 2, but the same applies to the embodiment shown in FIG. 3.

An ammeter is connected to the source electrode as one electrode 5A, the drain electrode as the other electrode 5B is structured so that drain voltage Vd can be applied, and the current that flows between the nanogap electrodes is measured by the drain voltage.

Since the nanodevices shown in FIG. 1 to FIG. 3 use at least one of the gate electrodes 9 as a floating gate electrode, various functions such as memory function and logical operation function are provided. These functions will be described sequentially below.

(Memory Function)

With the nanodevice according to the embodiment of the present invention, even if the switch is set to OFF after floating voltage Vf is applied to the floating gate electrode, the electric charge accumulated in the floating gate allows the state of electric charge of the metal nanoparticle to be stored. As shown in an example described later, retention characteristics of 12 hours or longer can be ensured at present.

(Multivalued Memory)

With the nanodevice according to the embodiment of the present invention, voltage to be applied to the floating gate electrode can be used to vary the state of electric charge of the metal nanoparticle in stages. As a result, the current that flows between the nanogap electrodes can be varied in stages. Consequently, by setting an arbitrary gate voltage, the state of electric charge of the metal nanoparticle can be varied in stages, multiple states can be expressed with only one memory, and thus the device can be used as a multi-valued memory.

Figure 4A:
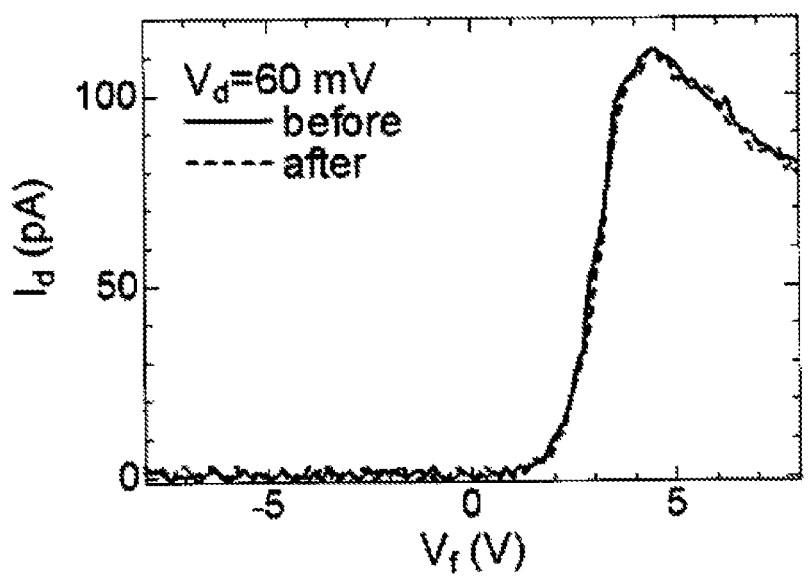
FIG. 4A shows drain current-gate voltage characteristics when drain voltage of a certain value is applied.
Figure 4B:
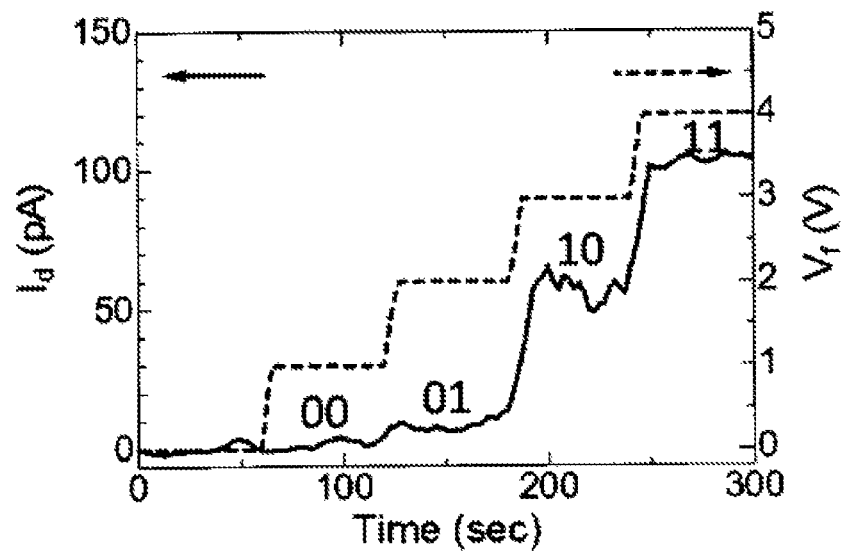
FIG. 4B shows time characteristics of the drain current.

FIG. 4 is a chart describing a case where the nanodevice according to the embodiment of the present invention is used as a multivalued memory. FIG. 4A shows drain current gate voltage characteristics obtained when drain voltage of a certain value is applied, and FIG. 4B shows time characteristics of the drain current. The horizontal axis in FIG. 4A represents floating gate voltage (V), and the vertical axis represents drain current (pA). The horizontal axis in FIG. 4B represents time (sec.), and the vertical axis represents drain current (pA). The solid line and the broken line in FIG. 4A represent the state before and after the sweep respectively. Since the metal nanoparticle functions as a Coulomb island, Coulomb oscillation is observed as the chain current—gate voltage characteristics. By dividing either ascending part or descending part, of the gradients of Coulomb oscillation, into arbitrary stages, the drain current is made to be different values. Consequently, as shown in FIG. 4B, by setting the gate voltage to fall on a certain level within a range from 1 (V) to 4 (V) for example, drain current corresponding to that level is fed, allowing multiple states to be maintained depending on the value of floating gate voltage Vf.

(Memory Stability)

With the nanodevice according to this embodiment, floating state is obtained by setting the switch to ON/OFF. This switch operation does not affect the memory operation of a single-electron transistor.

(Rewrite Operation of a Single-Electron Transistor)

The nanodevice according to the embodiment of the present invention has an input gate used as a signal input terminal, of the plurality of gates 9, and a control gate for applying floating voltage to perform rewrite operation. By applying voltage to the control gate, the state of electric charge of the nanoparticle changes, reversing the operation of the single-electron transistor. By allowing the input gate to be three inputs, for example, various logical operations such as XOR and XNOR can be achieved.

Figure 5:
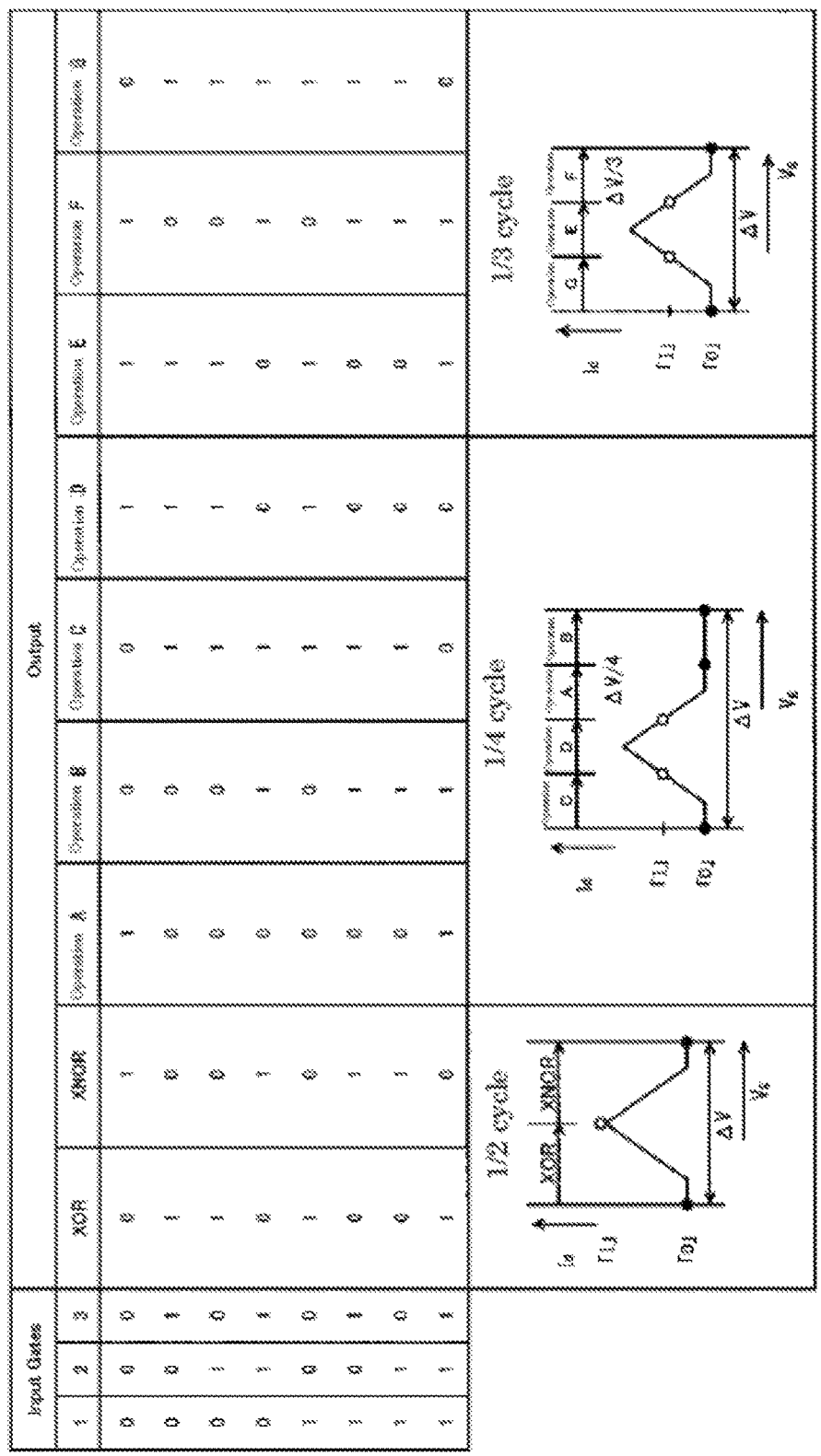
FIG. 5 is a chart showing a truth value table at three inputs.
Figure 6:
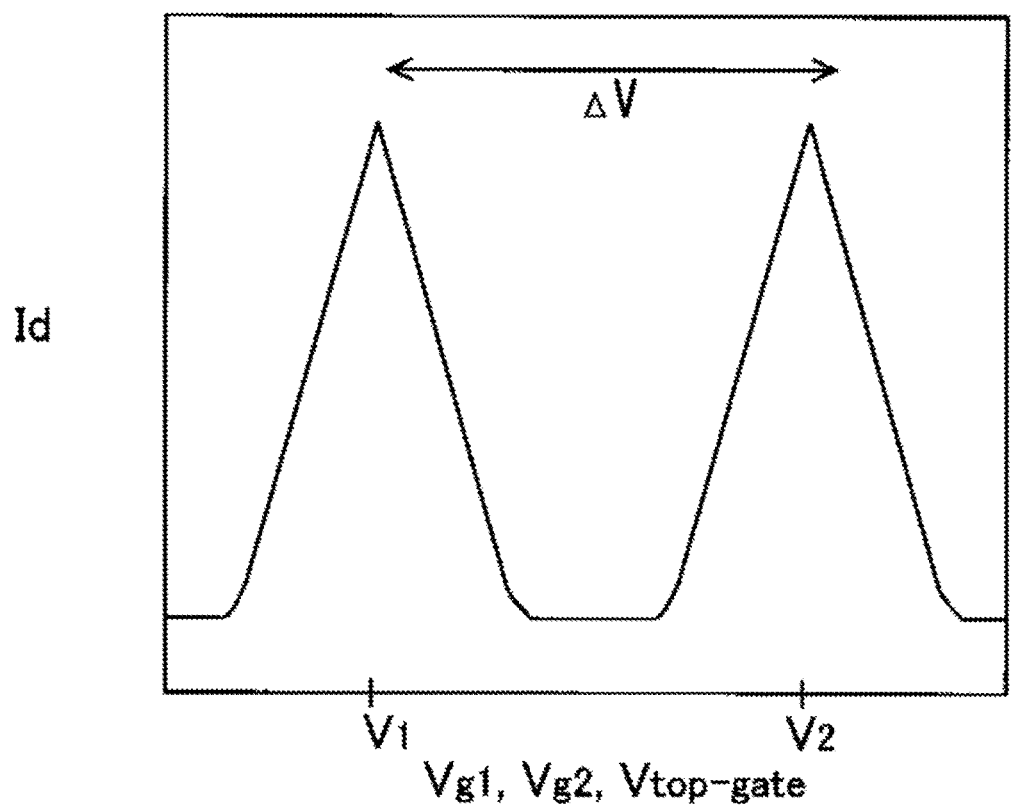
FIG. 6 is a chart schematically showing the waveform of drain current that flows depending on each gate voltage at a certain drain voltage.
Figure 7:
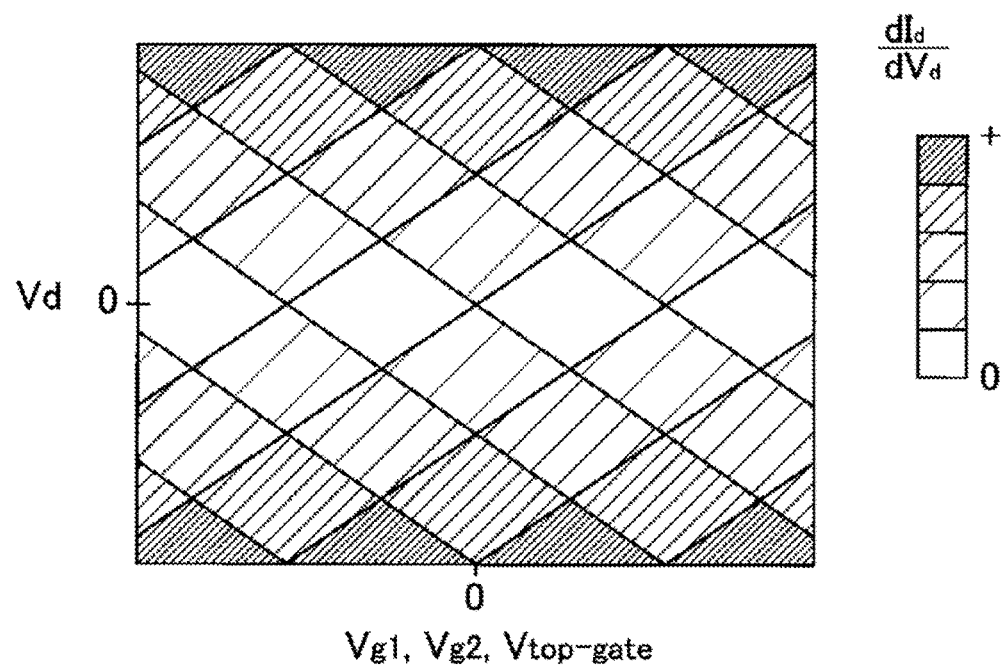
FIG. 7 is a chart schematically showing differential conductance of drain current I obtained when drain voltage $V_d$ and each gate voltage $V_{g1}$, $V_{g2}$, $V_{top\text{-}gate}$ are set at each value.

That the nanodevice having three input gates performs logical operations will be described in detail. FIG. 5 is a chart showing a truth value table at three inputs, with the method of setting gate voltage to perform each logical operation also being shown. Since the nanodevice has a structure of a single-electron transistor, the electric charge of a single-electron island, which is made up of a metal nanoparticle, is varied depending on the gate voltage, and as a result two states, namely the state where current is fed and that where no current is fed, are exhibited cyclically, which is so-called a Coulomb oscillation phenomenon. FIG. 6 schematically shows the waveform of drain current fed depending on each gate voltage, and FIG. 7 schematically shows the differential conductance of drain current I obtained when the drain voltage $V_d$ and each gate voltage $V_{g1}$, $V_{g2}$, $V_{top\text{-}gate}$ are set at each value. In FIG. 7, the magnitude of differential conductance of drain current I is shown to increase with the increase in mesh density. As shown in FIG. 6, the current waveform in Coulomb oscillation characteristics is extrapolated by a straight line having positive and negative gradients in two voltage directions, drain voltage $V_d$ and each gate voltage, and the current value has a peak.

As shown in FIG. 5, the difference between gate voltage V1 determining the peak current and gate voltage V2 determining the peak current on the immediate right $\Delta V$ (=V2−V1) is equivalent to Coulomb oscillation for one cycle, and gate capacity C is found by $C=e/\Delta V$, where e is elementary charge. This $\Delta V$ value depends on the arrangement relation between the metal nanoparticle and one electrode and the other electrode, and furthermore on the arrangement relation between the two side gate electrodes and top gate electrode and/or bottom gate electrode. Since the $\Delta V$ value thus depends on the arrangement of the three gate electrodes, the three gate electrodes have different $\Delta V$ values depending on the Coulomb oscillation of drain current $I_d$ for one cycle.

(Rewrite Operation 1 of Single-Electron Transistor: XOR and its Reverse Operation)

To allow a nanodevice having three input gates to perform exclusive OR (XOR) operation, it is only necessary to set each gate voltage value as follows. In XOR operation, drain voltage is adjusted so that the difference in voltages equivalent to "0" and "1" inputs applied to the three input gates becomes the voltage difference equivalent to $\Delta V/2$ (½ cycle). And, top gate voltage equivalent to "1" input is regarded as the gate voltage constituting the peak current of Coulomb oscillation, whereas the gate voltage equivalent to "0" voltage is regarded as a voltage value smaller by $\Delta V/2$. The top gate voltage is made to be "0" input as determined previously. Then regarding one side gate voltage, the side gate voltage constituting peak current is made to be gate voltage equivalent to "1" input, whereas the gate voltage equivalent to "0" input is made to be a voltage value smaller by $\Delta V/2$. "0" is input as the top gate voltage and one side gate voltage, and furthermore, regarding the other side gate voltage, the gate voltage constituting peak current is made to be gate voltage equivalent to "1" input, and the gate voltage equivalent to "0" voltage is made to be a voltage value smaller by $\Delta V/2$. At that time, the input gate voltage is set so that all the three gate voltages become equivalent to "1" input, and have a current peak value of "1" output.

When all the three gate voltages are set to "0" state, no current is fed and the output becomes "0."

When the gate voltage of any one of the three gate electrodes is set to "1" state, and the gate voltage of the remaining two is set to "0,", peak current is fed and the output becomes "1."

When any two gate voltages, of the three gate electrodes, are set to "1" and the gate voltage of the remaining one is set to "0," superposition inducing electric charge to a single-electron island occurs due to the gate voltage, causing a state where $\Delta V$ for one cycle is applied and thus allowing the output to become "0" state.

Allowing the three gate voltages to be in "1" state is equivalent to applying $\Delta V$ for 1.5 cycles, and so the output becomes "1."

The XOR column in the logical correspondence table shown in FIG. 5 shows the result of output current described above. Of the output results, "0" shows a state where no current is fed or small current is fed, whereas "1" shows a state where current is fed or large current is fed.

The lowest column of the logical correspondence table shows Coulomb oscillation for one cycle (the horizontal axis represents gate voltage, and the vertical axis represents drain current), black circle (●) represents the state of "0" current output, and white circle (○) represents the state of "1" current output. With XOR operation, $\Delta V/2$ potential difference is used as the difference in electric potential, namely the difference between the state of "0" and "1" of the input gate voltage. Since the output is "0" on the side of "0" input, the voltage range on the left half of Coulomb oscillation for one cycle is used as the voltage to be applied to each gate electrode.

As described above, the relation between the combination of gate electrode input and the output is the output of exclusive OR (XOR) operation, which is why the nanodevice can achieve logical operation based on Coulomb oscillation characteristics and superposition phenomenon inducing electric charge to the single-electron island by the plurality of gate electrodes.

With the nanodevice according to the embodiment of the present invention, of the plurality of gate electrodes, the remaining gate electrode not used as a gate electrode for inputs of an arbitrary number is used as a floating gate electrode, shift is made to + or − side by half of the peak-to-peak voltage of Coulomb oscillation of the floating gate electrode, and the switch is set to OFF to induce electric charge to the floating gate. The induced electric charge reverses the state of electric charge of the metal nanoparticle. Such a floating gate achieves a rewritable logical operation circuit.

In this case, the voltage to be applied to the floating gate need not be half of the peak-to-peak voltage of Coulomb oscillation. It is only necessary that the voltage can reverse the state of electric charge of the metal nanoparticle. Factors determining the voltage to be applied to the floating gate include: (1) the arrangement relation between the metal nanoparticle and the nanogap electrode, (2) the arrangement relation between the metal nanoparticle and each gate electrode, (3) whether the top gate or the bottom gate, of the gates, is used as the floating gate, and (4) the thickness and permittivity value of the second insulation layer to provide the top gate. The voltage is affected by at least one of the factors listed above.

(Other Logical Operations as the Presupposition of Rewrite Operation 2 of a Single-Electron Transistor)

A case where the nanodevice is made to perform exclusive not OR (XNOR) operation is described below. In this case, it is only necessary to set each gate voltage value as follows. In XNOR operation, the drain voltage is adjusted, as in the case of XOR operation, so that the difference in input voltage between "0" and "1" becomes the gate voltage difference equivalent to $\Delta V/2$, and the gate voltage of the input is set so that current peak value of "1" output is exhibited when all the three gate voltages are equivalent to "0" input. And based on the same operation principle as XOR, XNOR logical operation can be achieved by this gate voltage setting, which means that the right half of the voltage range of the Coulomb oscillation chart for one cycle is used as the voltage to be applied to each gate electrode.

The drain voltage is then adjusted by using $\Delta V/4$ (¼ cycle) as the voltage difference between "0" input and "1" input so that the intermediate value on the positive slope before the current peak and that on the negative slope after the peak of the Coulomb oscillation exhibit the same current value when two gate voltages having a voltage difference of $\Delta V/4$ is applied. As shown in Coulomb oscillation characteristics in ¼ cycle shown in FIG. 4, when the gate voltage is shifted by $\Delta V/4$, input is changed as follows: "0," "1," "1,", and "0".

A case where operation A or operation C is performed will be described. In this case, it is only necessary to set the input voltage value of each gate at the gate voltage equivalent to operation A of Coulomb oscillation for ¼ cycle shown in FIG. 5. In other words, the drain voltage is adjusted so that the value obtained by equally dividing $\Delta V$ into four becomes the same current value on the positive and negative slopes of the peak current of Coulomb oscillation, the top gate voltage equivalent to "0" input is set to the voltage value on the negative slope of the peak current, and the top gate voltage equivalent to "1" is set to a voltage value higher than the set voltage value by $\Delta V/4$.

Next, regarding the setting of the voltage of one side gate, "0" input is set as the top gate voltage as previously determined, the voltage value of one side gate is set to be the voltage value on the negative slope of the peak current so that the value obtained by equally dividing $\Delta V$ into four becomes the same current value on the positive and negative slopes of the peak current of Coulomb oscillation, and the top gate voltage equivalent to "1" input is set to a voltage value higher than the set voltage by $\Delta V/4$.

Furthermore, regarding the setting of the voltage of the other side gate, "0" input is set as the top gate voltage and one side gate voltage, the voltage value of the other side gate equivalent to "0" input is set to the voltage value on the negative slope of the peak current so that the value obtained by equally dividing $\Delta V$ into four becomes the same current value on the positive and negative slopes of the peak current of Coulomb oscillation, and the top gate voltage equivalent to "1" input is set to a voltage value higher than the set voltage by $\Delta V/4$.

The gate voltage of the input is set so that current peak value of "1" output is exhibited when all of the three gate voltages are equivalent to "1" input. Then the output becomes "1" only when the inputs into the three gates are (0, 0, 0) and (1, 1, 1), and in other cases the output becomes "0," allowing operation A to be performed.

Reversely, the gate voltage equivalent to operation C is set as follows. The top gate voltage equivalent to "1" input is set to the voltage value on the positive slope of the peak current so that the value obtained by equally dividing $\Delta V$ into four becomes the same current value on the positive and negative slopes of the peak current of Coulomb oscillation, and the top gate voltage equivalent to "0" input is set at a voltage value lower than the set voltage value by $\Delta V/4$.

Then, regarding the one side gate voltage setting, "0" input is set as the top gate voltage as determined previously, the voltage value of one side gate equivalent to "1" input is set at the voltage value on the positive slope of the peak current so that the value obtained by equally dividing $\Delta V$ into four becomes the same current value on the positive and negative slopes of the peak current of Coulomb oscillation, and the top gate voltage equivalent to "0" input is set at a voltage value lower than the set voltage value by $\Delta V/4$.

Furthermore, regarding the voltage setting of the other side gate, "0" input is set as the top gate voltage and the voltage of one side gate, the voltage value of the other side gate equivalent to "1" input is set to the voltage value on the positive slope of the peak current so that the value obtained by equally dividing $\Delta V$ into four becomes the same current value on the positive and negative slopes of the peak current of Coulomb oscillation, and the top gate voltage equivalent to "0" input is set at a voltage value lower than the set voltage value by $\Delta V/4$.

Then the output becomes "0" only when the inputs into the three gates are (0, 0, 0) and (1, 1, 1), and in other cases the output becomes "1," allowing logical operation C to be performed.

Next, the operation B or operation D will be described. In this case also, the drain voltage is adjusted by using $\Delta V/4$ as the voltage difference between "0" input and "1" input so that the same value is obtained as the intermediate value on the positive and negative slopes of the peak current. The gate voltage equivalent to operation B is set as follows.

For example, the top gate voltage equivalent to "1" input is set to a value higher than the voltage value on the positive slope of the peak current by ¾ times $\Delta V$ so that the value obtained by equally dividing $\Delta V$ into four becomes the same current vale on the positive and negative slopes of the peak current of Coulomb oscillation, and the top gate voltage equivalent to "0" input is set at a voltage value lower than the set voltage value by $\Delta V/4$.

Then, regarding the voltage setting of one side gate, "0" input is set as the top gate voltage as previously determined, the voltage value of one side gate equivalent to "1" input is set at a value higher than the voltage value on the positive slope of the peak current by ¾ times $\Delta V$ so that the value obtained by equally dividing $\Delta V$ into four becomes the same current value on the positive and negative slopes of the peak current of Coulomb oscillation, and the top gate voltage equivalent to "0" input is set at a voltage value lower than the set voltage value by $\Delta V/4$.

Furthermore, regarding the voltage of the other side gate, "0" input is set as the top gate voltage and the voltage of one side gate, the voltage value of the other side gate equivalent to "1" input is set at a value higher than the voltage value on the positive slope of the peak current by ¾ times $\Delta V$ so that the value obtained by equally dividing $\Delta V$ into four becomes the same current value on the positive and negative slopes of the peak current of Coulomb oscillation, and the top gate voltage equivalent to "0" input is set at a voltage value lower than the set voltage value by $\Delta V/4$.

Then, the output becomes "0" when the number of "0" input is 0 or 1, and in other cases, the output becomes "1", achieving logical operation B.

Reversely, the gate voltage equivalent to operation D is set as follows. For example, the top gate voltage equivalent to "0" input is set at a voltage value on the positive slope of the peak current so that the value obtained by equally dividing ΔV into four becomes the same current value on the positive and negative slopes of the peak current of Coulomb oscillation, and the top gate voltage equivalent to "1" input is set at a voltage value higher than the set voltage value by ΔV/4. When "1" is input, the above same current value is obtained on the negative slope.

Next, regarding the side gate voltage setting, "0" input is set as the top gate voltage as determined previously, the voltage value of one side gate equivalent to "0" input" is set at a voltage value on the positive slope of the peak current so that the value obtained by equally dividing ΔV into four becomes the same current value on the positive and negative slopes of the peak current of Coulomb oscillation, and the top gate voltage equivalent to "1" input is set at a voltage value higher than the set voltage value by ΔV/4.

Furthermore, regarding the voltage setting of the other side gate, "0" input is set as the top gate voltage and the voltage of one side gate, the voltage value of the other side gate equivalent to "0" input is set at a voltage value on the positive slope of the peak current so that the value obtained by equally dividing ΔV into four becomes the same current value on the positive and negative slopes of the peak current of Coulomb oscillation, and the top gate voltage equivalent to "1" input is set at a voltage value higher than the set voltage value by ΔV/4.

Then, the output becomes "1" when the number or "0" input is 0 or 1, and in other cases the output becomes "0," achieving logical operation D.

It is also possible to allow the nanodevice to operate as follows. Specifically, by using ΔV/3 as the voltage difference between "0" input and "1" input, the drain voltage is adjusted so that the same current value is obtained on the positive slope before the current peak and on the negative slope after the peak of Coulomb oscillation when two gate voltages having voltage difference of ΔV/3 are applied.

The gate voltage equivalent to operation E is set as follows. For example, the top gate voltage equivalent to "0" input is set at a voltage value on the positive slope of the peak current so that the value obtained by equally dividing ΔV into three becomes the same current value on the positive and negative slopes of the peak current of Coulomb oscillation, and the top gate voltage equivalent to "1" input is set at a voltage value higher than the set voltage value by ΔV/3.

Next, regarding the voltage setting of one side gate, "0" input is set as the top gate voltage as determined previously, the side gate voltage value equivalent to "0" input is set at a voltage value on the positive slope of the peak current so that the value obtained by equally dividing ΔV into three becomes the same current value on the positive and negative slopes of the peak current of Coulomb oscillation, and the top gate voltage equivalent to "1" input is set at a voltage value higher than the set voltage value by ΔV/3.

Furthermore, regarding the voltage setting of the other side gate, "0" input is set as the top gate voltage and the voltage of one side gate, the voltage value of the other side gate equivalent to "0" input is set at a voltage value on the positive slope of the peak current so that the value obtained by equally dividing ΔV into three becomes the same current value on the positive and negative slopes of the peak current of Coulomb oscillation, and the top gate voltage equivalent to "1" input is set at a voltage value higher than the set voltage value by ΔV/3.

Then, logical operation E, where the output becomes "0" only when the number of "1" input is 2, and in other cases the output becomes "1," is achieved.

Reversely, the gate voltage equivalent to operation F is set as follows. For example, the top gate voltage equivalent to "0" input is set at a voltage value on the negative slope of the peak current so that the value obtained by equally dividing ΔV into three becomes the same current value on the positive and negative slopes of the peak current of Coulomb oscillation, and the top gate voltage equivalent to "1" input is set at a voltage value higher than the set voltage value by ΔV/3.

Then, regarding the voltage setting of one side gate, "0" input is set as the top gate voltage as determined previously, the voltage value of one side gate equivalent to "0" input is set at a voltage value on the negative slope of the peak current so that the value obtained by equally dividing ΔV into three becomes the same current value on the positive and negative slopes of the peak current of Coulomb oscillation, and the top gate voltage equivalent to "1" input is set at a voltage value higher than the set voltage value by ΔV/3.

Furthermore, regarding the voltage setting of the other side gate, "0" input is set as the top gate voltage and the voltage of one side gate, the voltage value of the other side gate equivalent to "0" input is set at a voltage value on the negative slope of the peak current so that the value obtained by equally dividing ΔV into three becomes the same current value on the positive and negative slopes of the peak current of Coulomb oscillation, and the top gate voltage equivalent to "1" input is set at a voltage value higher than the set voltage value by ΔV/3.

Then, logical operation F, where the output becomes "0" only when the number of "1" input is 1, and in other cases, the output becomes "1," is achieved.

The gate voltage equivalent to operation G is set as follows. For example, the top gate voltage equivalent to "1" input is set as follows. ΔV is equally divided into three so that the value obtained by equally dividing ΔV into three becomes the same value on the positive and negative slopes of the peak current of Coulomb oscillation, and is set as a value on the positive slope of the peak current. The top gate voltage equivalent to "0" input is set at a voltage value lower than the set value by ΔV/3.

Then, regarding the voltage setting of one side gate, "0" input is set as the top gate voltage as determined previously, and the voltage value of one side gate equivalent to "1" input is set as follows. ΔV is equally divided into three so that the value obtained by equally dividing ΔV into three becomes the same value on the positive and negative slopes of the peak current of Coulomb oscillation, and is set as a value on the positive slope of the peak current. The top gate voltage equivalent to "0" input is set at a voltage value lower than the set value by ΔV/3.

Furthermore, regarding the voltage setting of the other side gate, "0" input is set as the top gate voltage and the voltage of one side gate, and the voltage value of the other gate equivalent to "1" input is set as follows. ΔV is equally divided into three so that the value obtained by equally dividing ΔV into three becomes the same value on the positive and negative slopes of the peak current of Coulomb oscillation, and is set as a value on the positive slope of the peak current. The top gate voltage equivalent to "0" input is set at a voltage value lower than the set value by ΔV/3.

Then, logical operation G, where the output becomes "1" only when the number of "1" input is 1 or 2, and in other cases, the output becomes "0," is achieved.

As described above, the nanodevice achieves 3-input logical operations by setting the potential difference between High and Low, potential difference between "0" and "1" for example, to $\Delta V/n$, and setting n to integers of 2 or higher.

In this case, if leakage current is fed from the side gate electrodes 9A, 9B to one electrode 5A and the other electrode 5B, namely source and drain electrodes, ON/OFF ratio decreases, which is undesirable. It is therefore necessary to ensure a large gap length to prevent leakage current from flowing.

(Rewrite Operation of Single-Electron Transistor 2: Reversal Processing in Other Logical Operations)

To allow the nanodevice according to the embodiment of the present invention to perform various logical operations, the remaining gate electrode not used as the 3-input gate electrode, of the plurality of gate electrodes, is used as a floating gate electrode, as in the case of reversal processing in XOR, shift is made to + or − side by half of the peak-to-peak voltage of Coulomb oscillation of the floating gate electrode, and the switch is set to OFF to induce electric charge to the floating gate. The induced electric charge causes the state of electric charge of the metal nanoparticle to be reversed. Thanks to such a floating gate, the nanodevice achieves rewritable logical operation element.

In this case, the voltage to be applied to the floating gate need not be half of the peak-to-peak voltage of Coulomb oscillation. It is only necessary that the voltage can reverse the state of electric charge of the metal nanoparticle. Factors determining the voltage to be applied to the floating gate include: (1) the arrangement relation between the metal nanoparticle and the nanogap electrode, (2) the arrangement relation between the metal nanoparticle and each gate electrode, (3) whether the top gate or the bottom gate, of the gates, is used as the floating gate, and (4) the thickness and the permittivity value of the second insulation layer to provide the top gate. The voltage is affected by at least one of the factors listed above.

(Method for Producing the Nanodevice)

A method for producing a nanodevice according to each embodiment of the present invention will be described by referring to an example shown in FIG. 3.

Step 1: A first insulation layer 2 is formed on a semiconductor substrate 1. To form a bottom gate electrode 9D, the semiconductor substrate 1 is etched to allow a part to become the bottom gate electrode 9D to remain intact.

Step 2: An adhesion layer partially constituting seed electrodes 3A, 3B is formed on the first insulation layer 2.

Step 3: An electrode pair and a side electrode pair are formed by electroless plating process, and then the gap length is shortened by the molecular ruler electroless plating process as required so that the gap length becomes a predetermined value. By steps 2 and 3, nanogap electrodes 5 having seed electrodes 3A, 3B and plating electrodes 4A, 4B are formed. Side gate electrodes 9A, 9B are also formed by steps 2 and 3.

Step 4; As shown by the broken line in FIG. 3, a metal nanoparticle 7 covered with a protective molecule is introduced into the nanogap, and a second insulation layer 8 is formed by the catalytic chemical vapor deposition (Cat-CVD) process, optical CVD process, etc. A top gate electrode 9C is then formed.

Specifically, in step 2, the adhesion layer is formed on the first insulation layer 2 so that a gap larger than the final gap length is formed. The seed electrode layer is then formed on the adhesion layer with a gap allowed in between, forming a pair. A substrate having the seed electrode pair with an initial gap formed in between is thus prepared as a sample.

Next, in step 3, an electrode pair is formed by the electroless plating process. At that time, the sample is immersed in an electroless plating solution. Depending on the concentration of metal ions contained in the plating solution, immersion time is set. When a predetermined time has elapsed since the sample is immersed in the plating solution, the plating solution is replaced in order to form a flat surface. The flat surface is not necessarily a plane, and smooth curved surface may be included in uneven part. The flat surface here means that the height, or depth, of unevenness with respect to a reference surface falls within a range from 5 nm to 30 nm.

In the embodiment of the present invention, gate electrodes are not necessarily three, but four or more gate electrodes are allowed. The gate electrodes are classified into a bottom gate electrode, a top gate electrodes, and side gate electrodes depending on the positions they are arranged. Any materials can be used for each electrode, provided that predetermined voltage can be applied.

Of the three or more gate electrodes, four gate electrodes for example, namely two side gate electrodes, one bottom gate electrode, and one top gate electrode, arbitrary three are used to apply voltage, and the remaining one is used as an electrode for adjusting voltage. Since the two side gate electrodes have symmetric property with respect to an axis of installation of one and the other electrodes, it is desirable that either the bottom gate electrode or the top gate electrode be used to adjust voltage. The electrode for adjusting voltage may be set to 0V for example, and by referring to that value, voltage to be applied to other gate electrodes can be set.

(Nanodevice Having Control Gate Electrodes)

Figure 8A:
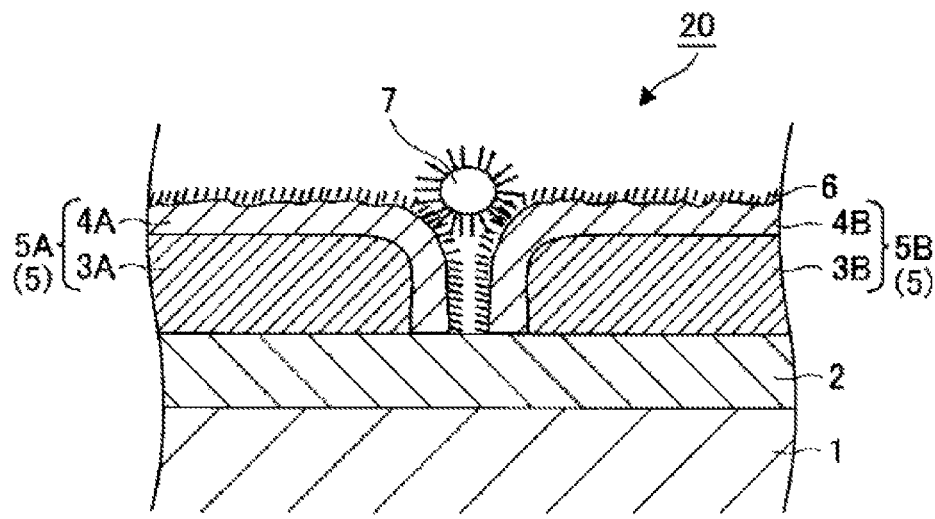
FIG. 8A is a cross-sectional view.
Figure 8B:
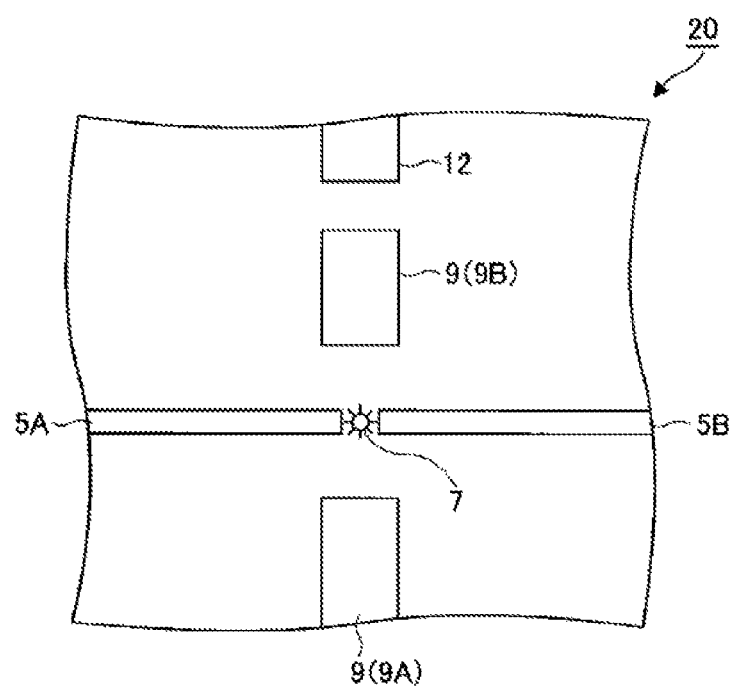
FIG. 8B is a plan view.

FIG. 8 shows an embodiment of a nanodevice according to the present invention, where FIG. 8A is a cross-sectional view, and FIG. 8B is a plan view. The nanodevice 20 according to the embodiment of the present invention includes nanogap electrodes 5 made up of one electrode 5A and the other electrode 5B, a metal nanoparticle 7 disposed in the nanogap, and a plurality of gate electrodes 9, and at least one of the plurality of gate electrodes 9 is made to function as a floating gate electrode 9B. For example, one electrode 5A corresponds to a source electrode, and the other electrode 5B corresponds to a drain electrode. The nanodevice 20 according to the embodiment of the present invention has a control gate electrode 12 as shown in FIG. 8. The control gate electrode 12 can be regarded as a kind of gate electrode 9.

The one electrode 5A and the other electrode 5B are disposed facing the metal nanoparticle 7, and as the plurality of gate electrodes 9, a side gate electrode 9A and a floating gate electrode 9B are disposed facing the metal nanoparticle 7. The control gate electrode 12 is disposed facing the metal nanoparticle via the floating gate electrode 9B.

As shown in FIG. 8, the one electrode 5, the other electrode 5B, the side gate electrode 9A, the floating gate electrode 9B, and the control gate electrode 12 are disposed on a same plane.

The plane on which these electrodes are arranged is the surface of the first insulation layer 2 provided on the substrate 1, as in the case of the embodiment shown in FIG. 3A. On the first insulation layer 2, the one electrode 5A, the other electrode 5B, the side gate electrode 9A, the floating gate electrode 9B, and the control gate electrode 12 are arranged, and between the one electrode 5A and the other electrode 5B, the metal nanoparticle 7 is placed. Preferably, as in the case of the embodiment shown in FIG. 3A, a second insulation layer 8 is placed so as to cover the one electrode 5A, the other electrode 5B, the side gate electrode 9A, the floating gate electrode 9B, the control gate electrode 12, and the metal nanoparticle 7.

The floating gate electrode 9B and/or the control gate electrode 12 need not be placed on the first insulation layer 2, but may be placed on the second insulation layer 8 for example and various electrodes may be placed not only in the horizontal direct ion but also in the vertical direction. Namely, when the floating gate electrode 9B is placed on the second insulation layer 8, floating gate electrode 9B having a top gate structure may be formed on the metal nanoparticle 7. Furthermore, a third insulation layer may be formed on the second insulation layer 8 and the floating gate electrode 9B having the top gate structure, and the control gate electrode may be formed on the third insulation layer.

When voltage is applied, the control gate electrode 12 changes the state of electric charge of the floating gate electrode 9B, and so is used to control the state of electric charge of the metal nanoparticle 7, in the embodiment shown in FIG. 1, the state of electric charge of the floating gate electrode 9B is controlled by ON/OFF of the switch 11. Meanwhile, in the embodiment shown in FIG. 8, the state of electric charge of the floating gate electrode 9B is controlled by the pulse voltage applied to the floating gate electrode 12.

The pulse width and the voltage for changing the state of electric charge of the floating gate electrode depend on the structure and material of each of the back gate electrodes including floating gate electrode, control gate electrode, source electrode, drain electrode, and Si substrate, and on the capacitance generated accordingly and the resistance generated when voltage is applied. The floating gate electrode has capacitance between each of the control gate electrode, source electrode, drain electrode, and back gate electrode, and when pulse voltage is applied to the control gate electrode, potential difference corresponding to each capacitance is generated. From the electrode having the lowest resistance with the floating gate electrode, electric charge that makes the potential difference from that electrode to be 0 flows into the floating gate electrode, and as a result electric charge is induced into the floating gate electrode. Once the potential difference becomes 0, the electric charge of the floating gate electrode does not change even if a pulse voltage is applied after that. In other words, even if the pulse width is set to be longer than the time for accumulating electric charge that allows potential difference to become 0 in the floating gate electrode, induced electric charge does not change, and by setting the pulse width to shorter than that time, the amount of electric charge to be accumulated can be controlled. Regarding the pulse voltage, since the conduction mechanism for inducing electric charge to the floating gate electrode is non-linear type, sufficient pulse voltage must be ensured to move electric charge.

The nanogap electrode 5, side gate electrode 9A, floating gate electrode 9B, and control gate electrode 12 may be produced not by the molecular ruler plating process but by the electron beam lithography, electron beam deposition, and liftoff processes.

EXAMPLES

Example 1

As Example 1, nanodevice 10 shown in FIG. 2 was produced by following the procedure shown below.

First, gold nanogap electrodes 5 were produced by the electron beam lithography (EBL). A Si substrate on which a $SiO_2$ film was formed as a first insulating layer 2 was made to undergo ultrasonic cleaning using acetone and ethanol. After performing ozone cleaning, a solution prepared by mixing positive type resists ZEP-520a and ZEP-a (both being manufactured by ZEON CORPORATION) at the ratio of 1:2 was applied by spin coating. The substrate coated with the resists was baked at 180° C. for 2 minutes, EBL was then performed for this substrate, and development was performed using ZEP-520a (ZEON CORPORATION). Ti and Au were deposited on the developed substrate by the electron beam deposition. By lifting off the resists by immersing the substrate in ZDMAC (ZEON CORPORATION), an initial gold nanogap electrode having a gap length of 25 nm was produced. A contact pad for ensuring electrical contact between a prober and the nanogap electrode was then produced by depositing Ti and Au.

A gold nanogap electrode having a gap length of approximately 10 nm was then formed by the electroless gold plating process. Details of the process, which are described in Non-Patent Literature 2, will be omitted. By immersing the gold nanogap electrode in a solution prepared by mixing iodine tincture, gold foil, and ascorbic acid, the initial gold nanogap electrode was made to grow, forming gold nanogap electrodes 5A, 5B and two side gates 9A, 9B.

To the gold nanogap electrodes, a self-assembled monolayer film 6 and a gold nanoparticle 7 were introduced by following the procedure shown below. The method for producing the gold nanoparticle has been disclosed in Non-Patent Literature 6. First, to clean the gold nanogap electrodes, boiling cleaning was performed using acetone and ethanol for 10 minutes each, and then asking was performed using oxygen plasma for 20 minutes in total. After the cleaning, the gold nanogap electrodes were immersed in an ethanol solution for one hour to remove the oxidized gold film on the surface. The electrodes were then immersed in an ethanol solution (40° C.) having 0.1 mM hexanethiol molecule concentration for 24 hours to form a self-assembled monolayer film 6. The electrodes were then immersed in a toluene solution of octanethiol/decanedithiol mixed film protective gold nanciparticles produced by chemical synthesis for 30 minutes. The 8.2 nm core-diameter gold nanoparticle solution is heated at 150° C. for 5 minutes in advance to disperse aggregate. The gold nanoparticle, which has a core diameter of 8.2 nm, is chemically adsorbed to the gold via the decanedithiol molecule in the protective group. Consequently, the gold nanoparticle 7 bridges gold nanogap electrodes 5 having a gap length of 10 nm, thus operating as a single electron island of a single electron transistor. The nanodevice 10 in Example 1 was thus produced.

The produced nanodevice 10 was subjected to electric measurement in vacuum at 9K, and was made to operate as a circuit element whose operation is rewritable. Electric measurement was performed using a prober, with the electric contact of the side gate electrode made to be retractable mechanically.

Figure 9:
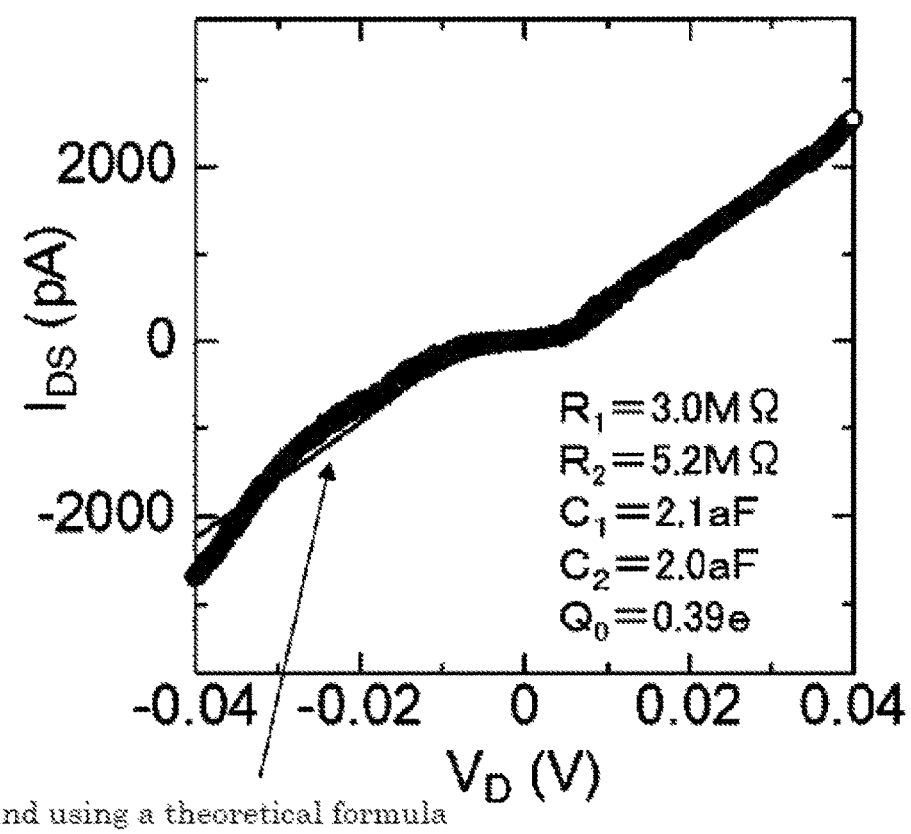
FIG. 9 is a chart showing drain current with respect to drain voltage of a sample produced in an example.

FIG. 9 is a chart showing drain current—drain voltage characteristics of a sample produced in Example 1. Measurement temperature was set at 9K. The horizontal axis represents drain voltage $V_d$ (V), and the vertical axis represents drain current $I_{DS}$ (pA). $R_1$, $R_2$, $C_1$, $C_2$, $Q_0$ in the chart are equivalent circuits described in Non-Patent Literature 3, showing values found by a theoretical formula of current—voltage characteristics of double tunnel coupling. The solid line represents the result of calculation of the theoretical formula using the above parameters, which corresponds well to experimental results because ideal double tunnel coupling has been formed as shown in FIG. 2.

Figure 10:
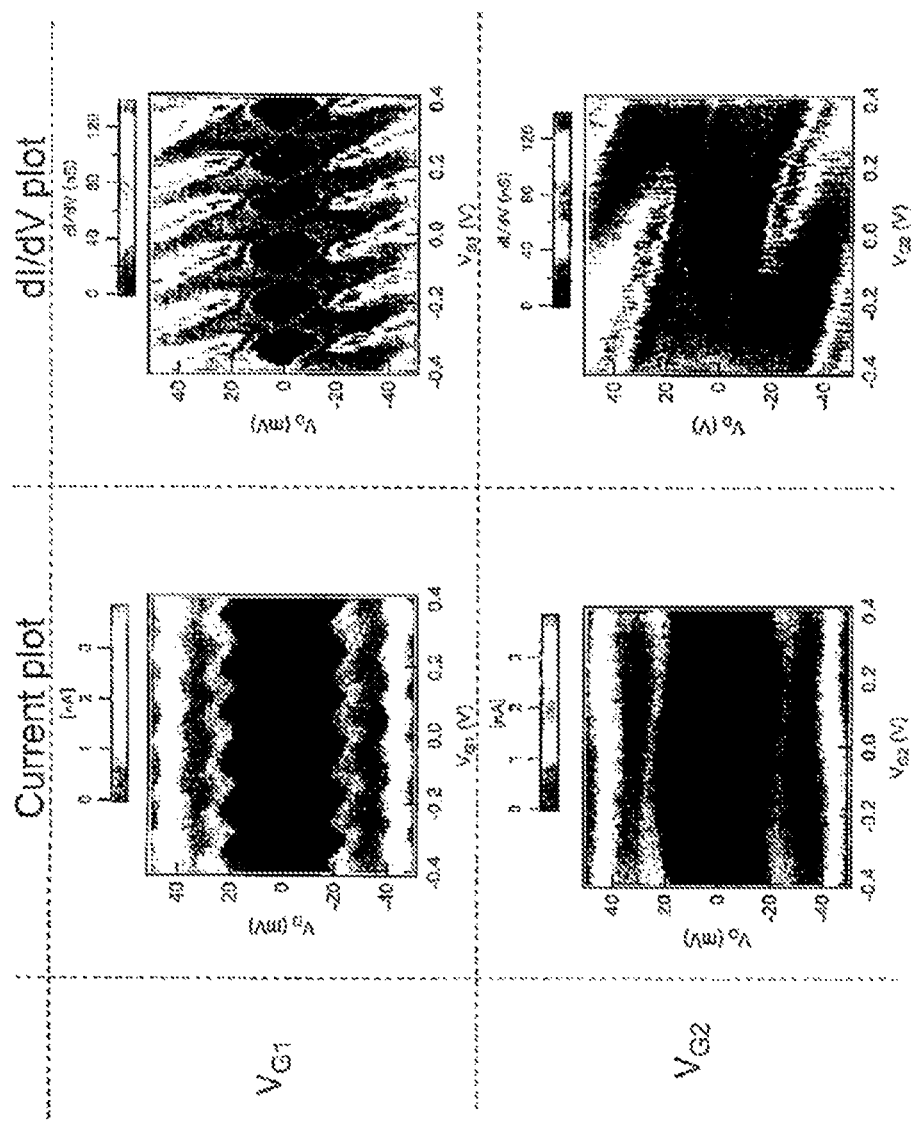
FIG. 10 is a chart showing the mapping (stability diagram) of drain current $V_D$ (mV) and differential conductance obtained when a first side gate voltage $V_{G1}$ (V) and a second side gate voltage $V_{G2}$ (V) are swept respectively.

FIG. 10 is a chart showing the mapping (stability diagram) of drain current $V_d$ (mV) and differential conductance (dI/dV) when a first side gate voltage $V_{G1}$ (V) and a second side gate voltage $V_{G2}$ (V) are swept respectively. The horizontal axis represents voltage (V) to be applied to each side gate, vertical axis represents drain voltage $V_d$ (V), and shading shows drain current (nA) and differential conductance (nS) of the drain current. Measurement temperature was set at 9K. Parallelogram-shaped voltage ranges, so called Coulomb diamond, resulting from suppression of current (Coulomb blockade) via Coulomb island between the drain electrode and the source electrode are found. This means that the produced sample functions as a single-electron transistor. Also, the shape of Coulomb diamond is parallelogram and has a cyclic structure against $V_{G1}$. This result also suggests that the produced sample has an ideal single-electron transistor structure having only one Coulomb island as shown in FIG. 1.

Figure 11A:
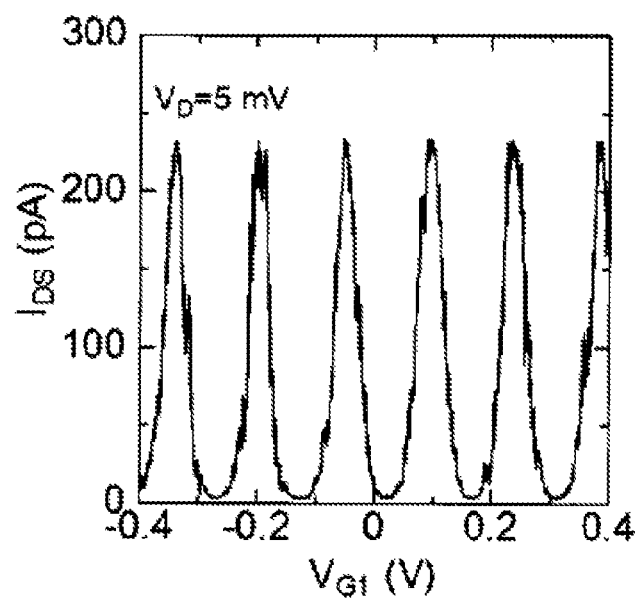
FIG. 11A shows the dependency of drain current $I_{DS}$ (pA) on the voltage applied to a first side gate when the second side gate is made to be 0 V.
Figure 11B:
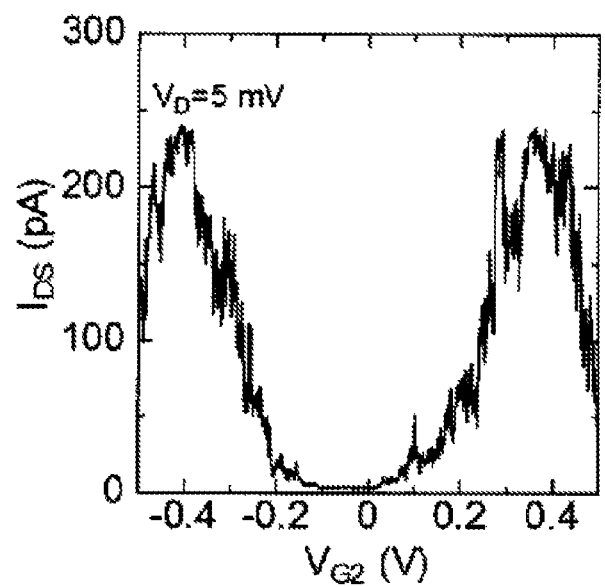
FIG. 11B shows the dependency of drain current $I_{DS}$ (pA) on the voltage applied to a second side gate when the first side gate is made to be 0 V.

FIG. 11 is a chart showing Coulomb oscillation characteristics, where FIG. 11A shows the dependency of drain current $I_{DS}$ (pA) on the voltage applied to a first side gate when the second side gate is made to be 0 V, and FIG. 11B shows the dependency of drain current $I_{DS}$ (pA) on the voltage applied to a second side gate when the first side gate is made to be 0 V. The drain voltage $V_d$ was set at 5 my. Cyclic Coulomb oscillation was found corresponding to the gate capacity $C_{G1}$, $C_{G2}$ of the side gate electrode for Coulomb island. In the subsequent drawings, the state of electric charge on the nanoparticle is adjusted using $V_{G1}$ as floating gate voltage, and $V_{G2}$ is made to have a role of signal input terminal for observing Coulomb oscillation.

Figure 12:
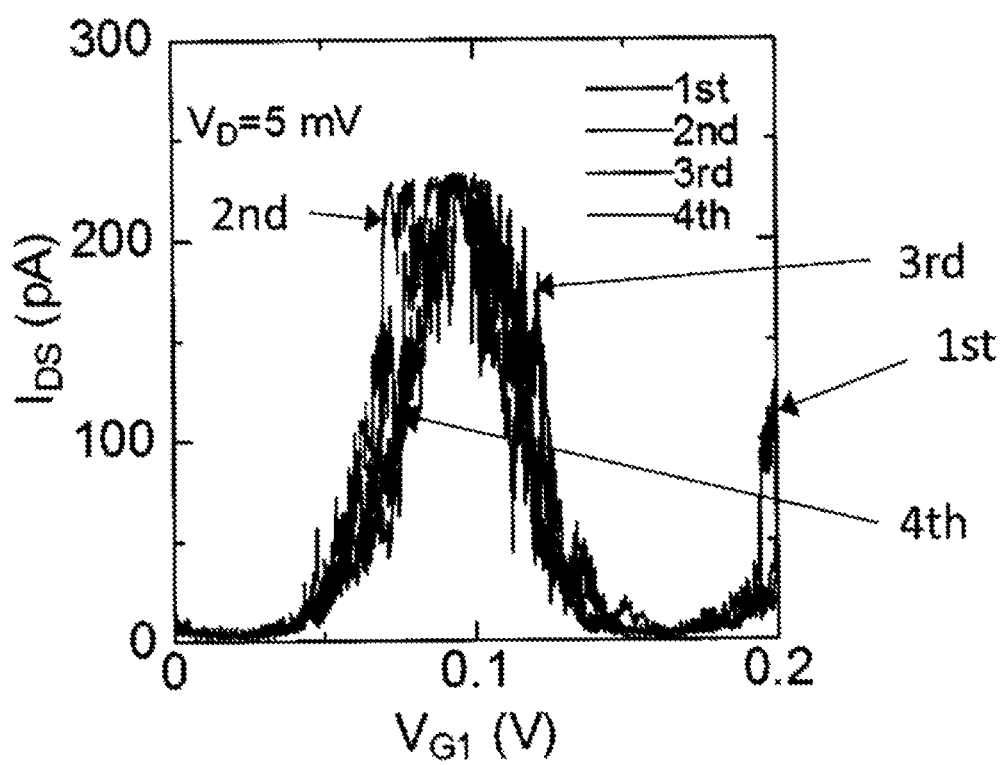
FIG. 12 is a magnified view of an area around the point of origin in FIG. 11A.

FIG. 12 is a magnified view of an area around the point of origin in FIG. 11A. The horizontal axis represents a first side gate voltage $V_{G1}$ (V), and the vertical axis represents drain current $I_{DS}$ (pA). Voltage was applied to the first side gate four times with the second side gate voltage being set at 0 V and the drain voltage at 5 mV. The results of measurements are also shown. Even if measurement is repeated, areas around Low state (approximately 0 pA) and High state (approximately 230 pA) were found to be stable, which is essential for stable logical operation.

Figure 13:
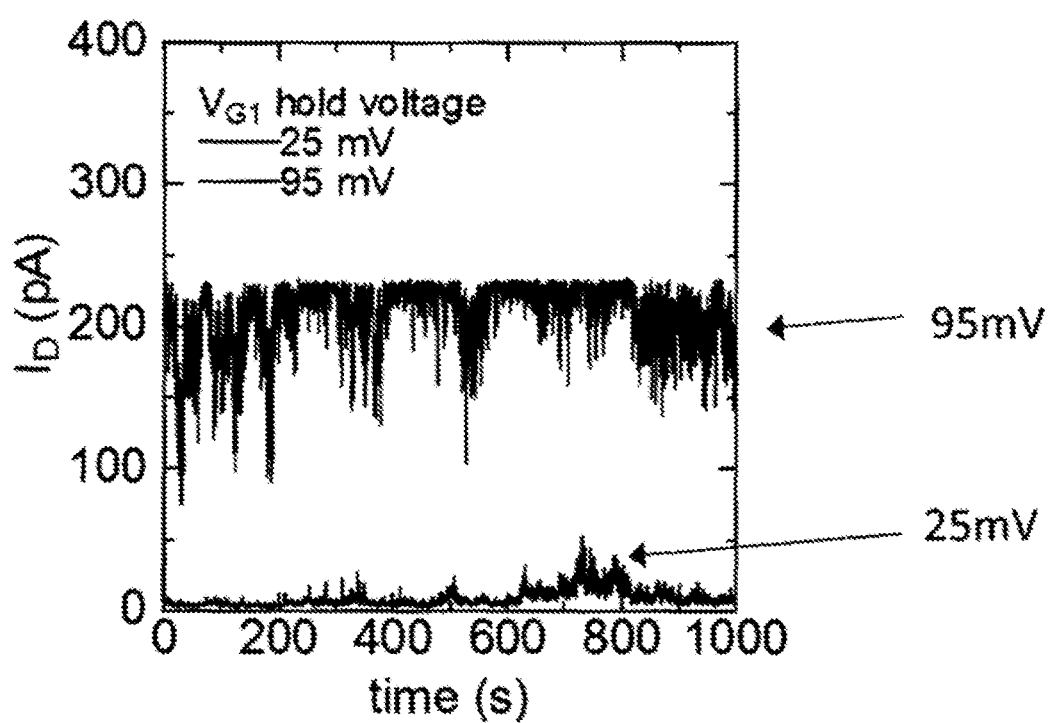
FIG. 13 is a chart extracting cases where the voltage applied to the first side gate $V_{G1}$ is 25 mV and 95 mV.

FIG. 13 shows the result of measurement of dependency of drain current on time performed with the voltage applied to the first side gate used as a parameter. Voltages of 25 mV and 95 mV were applied to the first side gate, and then the probe for applying voltage was retracted. In this case, the operation of charging the floating gate is called charge forming. In other words, charge forming means the operation of "applying a desired gate voltage to a probe for applying voltage, and retracting the probe for applying voltage from the gate electrode while maintaining that voltage." As a result, the electric charge induced to the gate electrode is maintained in a state not contacting the probe. The top waveform represents the dependency of drain current on time when $V_{G1}$=95 mV, and the bottom waveform represents the dependency of drain current on time when $V_{G1}$=25 mV. FIG. 13 reveals that the High state and the Low state shown in FIG. 12 can also be distinguished from each other in time characteristics after charge forming.

Figure 14A:
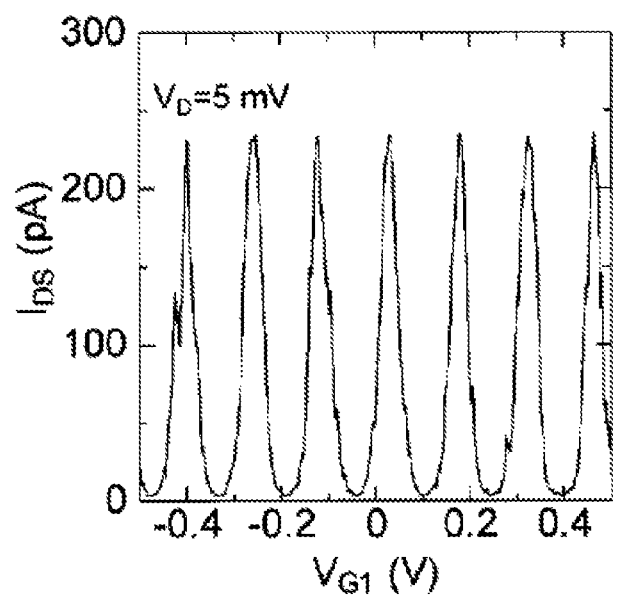
FIG. 14 is a chart showing Coulomb oscillation characteristics obtained after measurement shown in FIG. 13 was performed, where
Figure 14B:
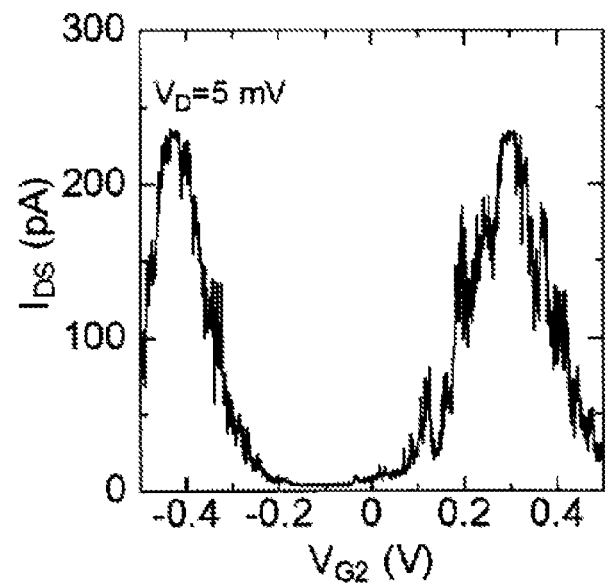

FIG. 14 is a chart showing Coulomb oscillation characteristics obtained after measurement shown in FIG. 13, where FIG. 14A shows the dependency of drain current $I_{DS}$ (pA) on the voltage applied to the first side gate when the second side gate is made to be 0V, and FIG. 14B shows the dependency of drain current $I_{DS}$ (pA) on the voltage applied to the second side gate when the first side gate is made to be 0V. The drain voltage $V_D$ was set at 5 mV. Since the state of electric charge on the nanoparticle has changed, compared to FIG. 11, High state is obtained when the first gate voltage is $V_{G1}$=30 my, and Low state is obtained when $V_{G1}$=100 mV.

Figure 15:
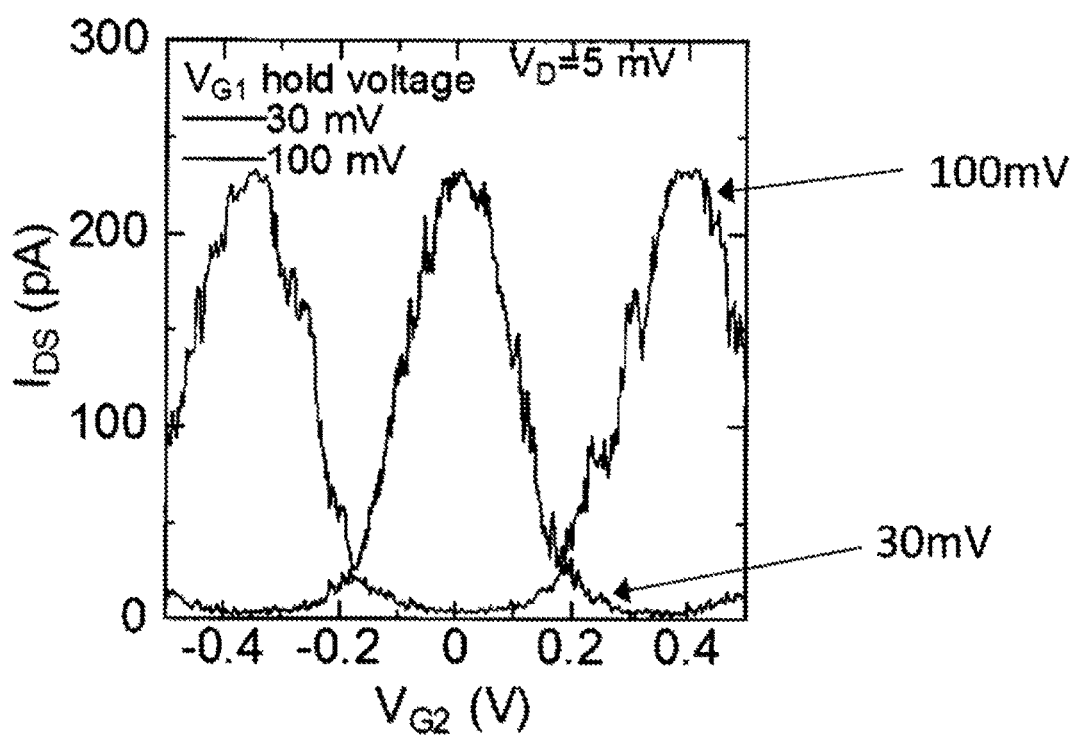
FIG. 15 is a chart showing the result of measurement of Coulomb oscillation characteristics performed at the second side gate voltage after performing charge forming at the first side gate.

FIG. 15 is a chart showing the result of measurement of Coulomb oscillation characteristics performed at the second side gate voltage by performing charge forming at the first side gate. Charge forming was performed with the voltage $V_{G1}$ to be applied to the first side gate fixed at 30 mV and 100 mV. By increasing $V_{G1}$ from 30 mV to 100 MV, it became possible to shift Coulomb oscillation by a half cycle. From this result, it was found that the state of electric charge of the metal nanoparticle can be changed by 0.5 e (e: elementary charge) by electric charge forming. When the second gate voltage is made to oscillate at two values of 0 V and 0.4 V under this $V_{G1}$ condition, the characteristics of the nanodevice is expected to oscillate between High and Low.

Figures 16A, 16B, 16C:
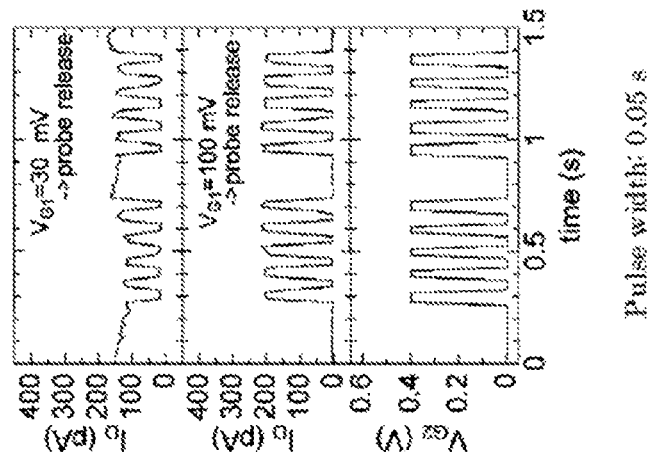
FIG. 16 shows the dependency of pulse width of the second side gate voltage on input, where FIGS. 16A, 16B, and 16C (A), (B), and (C) respectively show the case where the pulse width is 5 sec., 0.5 sec., and 0.05 sec.

FIG. 16 shows the dependency of pulse width of the second side gate voltage on input, where FIGS. 16A, 16B, and 16C respectively show the case where the pulse width is 5 sec., 0.5 sec., and 0.05 sec. Charge forming was performed with the first side gate voltage $V_{G1}$ set at 2 values: 30 mV and 100 mV. Pulse voltage taking 2 values (0 V and 0.4 V) was then input to the second side gate.

Comparison between the case where the first side gate voltage $V_{G1}$ is 30 mV and the case where it is 100 mV in FIG. 16 shows that the pulse response of the second side gate voltage has been reversed. In other words, depending on the charge forming condition, the operation of the nanodevice 10 for $V_{G2}$ has been rewritten. Also, the same result was obtained in any of the cases where the pulse width was set at 5 sec., 0.5 sec., and 0.05 sec. High-speed operation of the circuit can thus be expected.

From Example 1 described above, it was found that by allowing the voltage applied to at least one of the gate electrodes to shift by a half cycle of Coulomb oscillation, and allowing the gate electrode to be in floating state, the state of electric charge of metal nanoparticle can be reversed. It was also found that by using a gate electrode as a floating electrode, the operation of the nanodevice 10 can be rewritten.

Example 2

Another example of the nanodevice 10 shown in FIG. 2 will be described. By the same producing method as Example 1, gold nanogap electrodes 5 and two side gate electrodes 9A, 9B were produced. To this gold nanogap electrodes 5, a self-assembled film 6 and a gold nanoparticle 7 were introduced by following the procedure described below. First, the electrode was immersed in an ethanol solution having octanethiol molecule concentration of 1 mM for 24 hours to rinse it with ethanol. The electrode was then immersed in an ethanol solution having decanedithiol molecular concentration of 500 mM for 24 hours to insert the decanedithiol molecules into the octanethiol monomolecular film to form a self-assembled monolayer film 6 in which octanethiol and decanedithiol are mixed. Furthermore, after being rinsed with ethanol, the electrode was immersed in a toluene solution of decanethiol protected gold nanoparticle 7 produced by chemical synthesis for 16 hours. The gold nanoparticle having a diameter of 6.2 nm is made to be chemically adsorbed between the gold nanogap electrodes 5 by the decanedithiol molecules in the self-assembled monolayer film 6. By providing a floating gate electrode to this element, the element was allowed to be set to ON/OFF by electric charge forming. The nanodevice 10 in Example 2 was thus produced.

Figure 17:
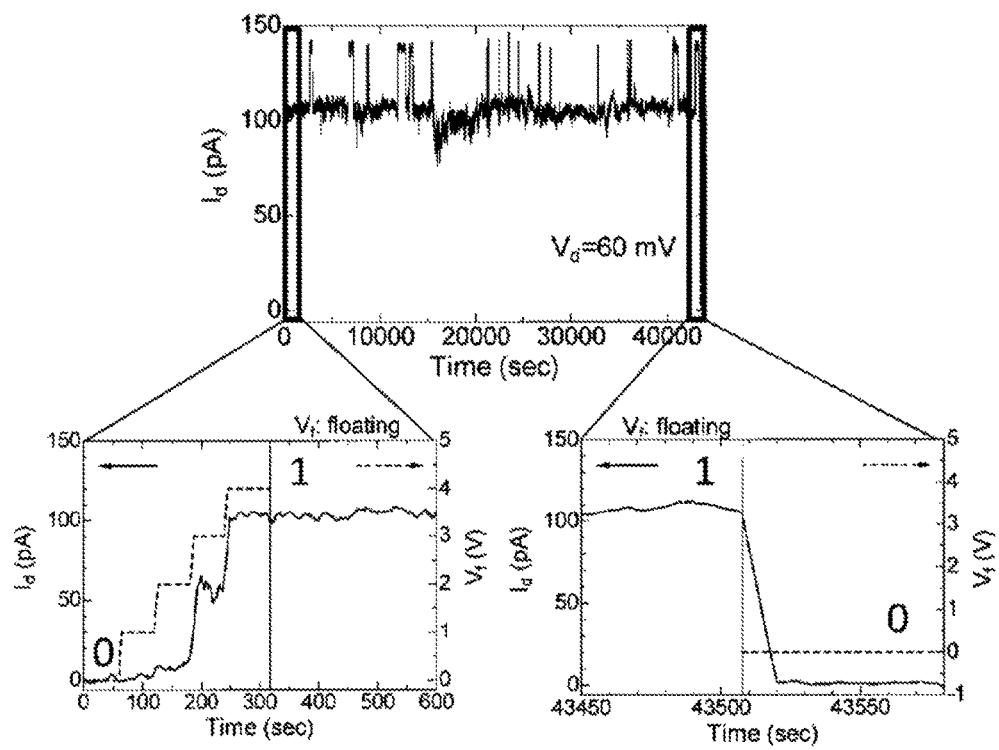
FIG. 17 is a chart showing the dependency of drain current on time when charge forming is performed with the side gate, where the solid line represents drain current, and the broken line represents the side gate voltage, of the nanodevice.

FIG. 17 is a chart showing the dependency of drain current on time when charge forming is performed with the side gate, where the solid line represents drain current, and the broken line represents side gate voltage, of the nanodevice. Measurement temperature was set at 9K. The dependency of this element on drain current—gate voltage is shown in FIG. 4. The drain voltage was set at $V_d$=60 mV. When the charge forming voltage $V_f$ was increased in stages from 0 V to 4 V in increment of 1V, the drain current increased in stages, which indicates that the nanodevice operated as a multivalued memory by electric charge forming. Furthermore, even when the side gate electrode was made to be in floating state by retracting the probe for applying voltage, with the electric charge forming voltage $V_f$ maintained at 4 V, after approximately 300 seconds have elapsed, the value of the drain current was found to be mostly unchanged for approximately 12 hours. This suggests that the state of electric charge on the gold nanoparticle can be maintained by the side gate electrode in a floating state for a long time, and that the operation of the nanodevice can be rewritten by electric charge forming. After approximately 43500 seconds have elapsed, the probe for applying voltage having been retracted was connected to the floating gate, with the electric charge forming voltage set at $V_f$=0 V, and the drain current returned to the initial state of 0 pA. FIG. 4 shows the dependency of the nanodevice on drain current—gate voltage before and after the measurement shown in FIG. 17. The same characteristics are shown before and after the measurement.

From the result of Example 2, it was found that the characteristics of nanodevice do not deteriorate by electric charge forming, and that the state of electric charge of the nanoparticle can be maintained for 12 hours or longer after electric charge forming.

Example 3

An example of nanodevice 10A having three input gates shown in FIG. 3 required for logical circuit operation such as 3-input XOR and XNOR will be described. First, by the same production method as Example 2, a nanodevice having two input gates was produced. After checking the operation of the nanodevice, a $Si_3N_4$ layer, which operates as a second insulation layer 8, was deposited by 50 nm on the nanodevice by the Cat-CVD process. The substrate temperature at the time of deposition process was set at approximately 65° C. Lastly, on the $Si_3N_4$ layer, a top gate electrode 9C was formed. Overlapping exposure by EBL and electrode deposition were performed under the same conditions as the case where the gold nanogap electrodes 5 and side gate electrodes 9A, 9B were produced to form a top gate electrode 9C on the metal nanoparticle 7. The nanodevice 10A in Example 3 was thus produced.

Figure 18C:
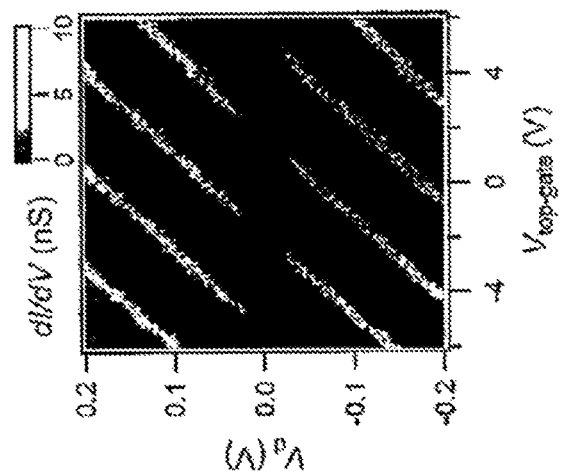
FIGS. 18A, 18B, and 18C respectively show Coulomb diamond characteristics of the nanodevice shown in FIG. 3 at three gate voltages.
Figure 18B:
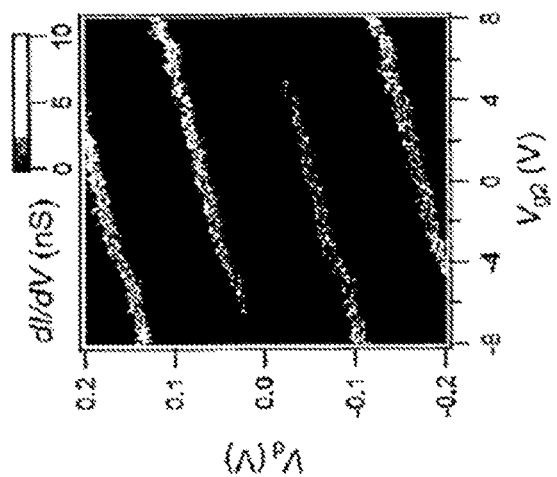
Figure 18A:
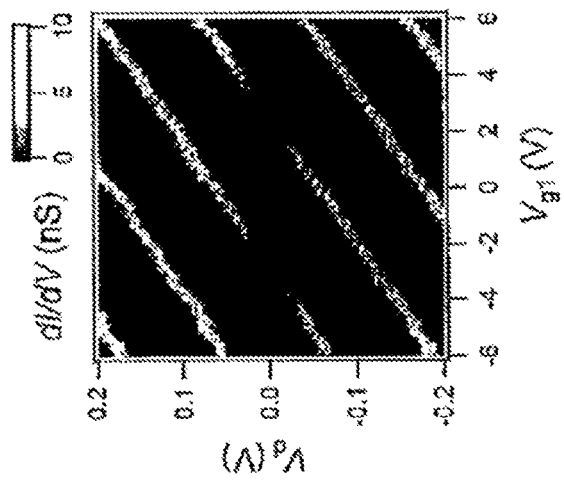
Figure 19:
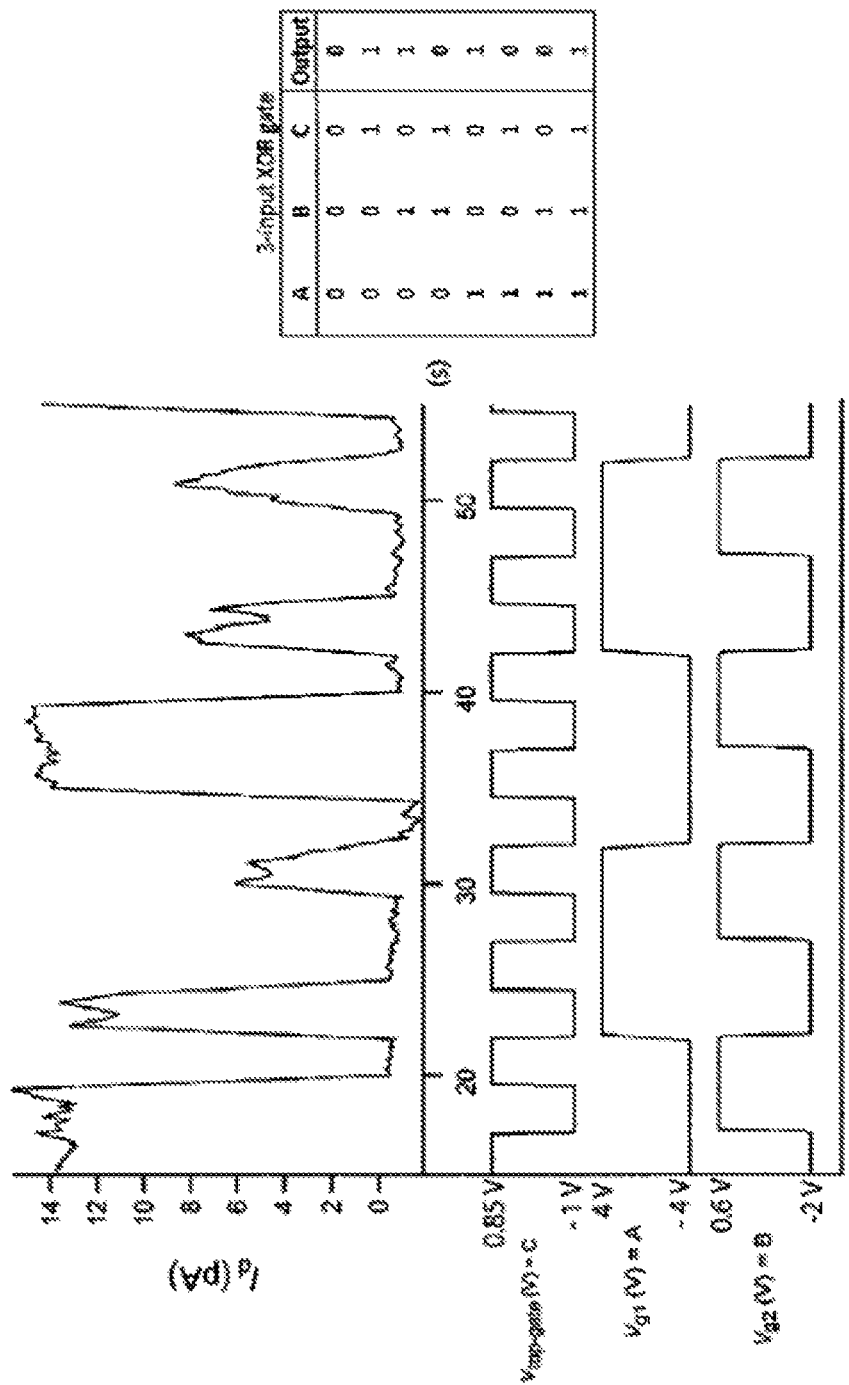
FIG. 19 is a chart showing that the nanodevice exhibits XOR operation by applying pulse train to the three gate voltages.

FIG. 18 is a chart showing the result of observation of Coulomb diamond characteristics performed by using each of the three gate electrodes of the nanodevice shown in FIG. 3, FIGS. 18A, 18B, and 18C showing cases where gate voltages $V_{g1}$, $V_{g2}$, $V_{top-gate}$ were applied to each of the gate electrodes 9A, 9B, and 9C. Measurement temperature was set at 9K, and appropriate nanodevice characteristics were obtained compared to the size of the metal nanoparticle used. FIG. 19 is a chart showing the result of operation, with a truth-value table added. The chart shows that by creating a pulse train with a voltage that can shift the state of electric charge on the nanoparticle by 0.5 e, namely ΔV/2, and applying that voltage to the three gate electrodes, the nanodevice exhibits 3-input XOR operation. In this structure, when electric charge forming is performed, allowing shift by 0.5 e with a gate electrode used as a floating electrode, it becomes possible to rewrite the 2-input XOR logic circuit into 2-input XNOR by using the remaining two electrodes.

From each of the above Examples, the state of electric charge of the metal nanoparticle can be controlled arbitrarily by the floating gate, thus allowing just one nanodevice to provide rewritable logical operations.

Example 4

By a similar production method as Example 1, a single-electron transistor having two input gates was produced. By a similar production method as Example 1, a gold nanogap electrode 5 and two side gate electrodes 9 were produced. To this gold nanogap electrode, a self-assembled monolayer film 6 and a gold nanoparticle 7 were introduced by following the procedure shown below. First, the electrode was immersed in an ethanol solution having hexanethiol molecular concentration of 0.1 mM for 15 hours to rinse it with ethanol to form a hexanethiol self-assembled monolayer film 6. Furthermore, after being rinsed with ethanol, the electrode was immersed in a toluene solution of gold nanoparticle 7 having protective group prepared by mixing octanethiol and decanedithiol for 0.5 hours. The 8.2 nm gold nanoparticle was made to be chemically adsorbed between the gold nanogap electrodes 5 by the decanedithiol molecules in the gold nanoparticle 7. A floating gate electrode was provided to this element, allowing the element to be set to ON/OFF by electric charge forming. The nanodevice 10 in Example 4 was thus produced.

FIG. 20 is a chart showing the mapping (stability diagram) of drain current $V_D$ (mV) and differential conductance (dI/dV) obtained when a first side gate voltage (floating voltage) $V_{FG}$ (V) and a second side gate voltage (control voltage) $V_{CG}$ (V) are respectively swept. The horizontal axis represents the voltage (V) applied to each side gate, the vertical axis represents drain voltage $V_D$ (V), and shading shows drain current (nA) and differential conductance (nS) of the drain current. The measurement temperature was set at 9K. Parallelogram-shaped voltage ranges, so called Coulomb diamond, resulting from suppression of current (Coulomb blockade) via Coulomb island between the drain electrode and the source electrode are found. This means that the produced sample functions as a single-electron transistor. Also, the shape of Coulomb diamond is parallelogram and has a cyclic structure against $V_{FG}$, $V_{CG}$. This result also suggests that the produced sample has an ideal single-electron transistor structure having only one Coulomb island as shown in FIG. 1.

Figure 21A:
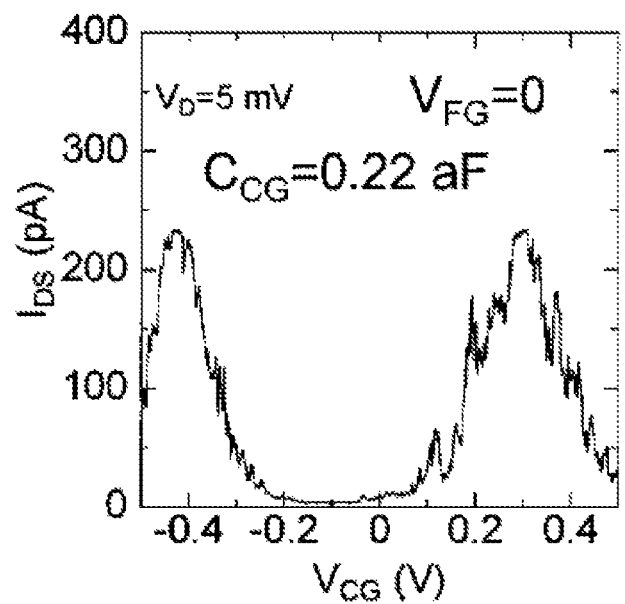
FIG. 21A shows $I_{DS}$-$V_{CG}$ characteristics obtained when the switch is set to off in a state where 0 V is applied to $V_{FG}$ to allow the floating gate electrode to be in floating state.
Figure 21B:
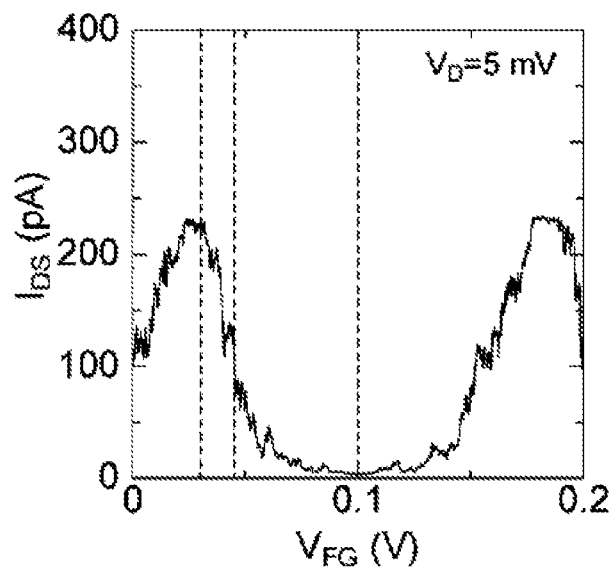
FIG. 21B shows $I_{DS}$-$V_{FG}$ characteristics obtained when voltage $V_{CG}$ is set to 0 V.

Coulomb oscillation exhibited when 2-input gate electrodes were independently swept was measured. FIG. 21A shows $I_{DS}$–$V_{CG}$ characteristics obtained when the switch is set to OFF in a state where 0 V was applied to $V_{FG}$ to allow the floating gate electrode to be in a floating state, and FIG. 21B shows $I_D$–$V_{FG}$ characteristics when voltage $V_{CG}$ was made to be 0 V. FIG. 21 clearly shows Coulomb oscillation corresponding to the stability diagram in FIG. 20. ΔV on the side of the floating gate electrode was found to be 150 mV, and ΔV on the side of the control gate was found to be 730 mV.

Figure 22:
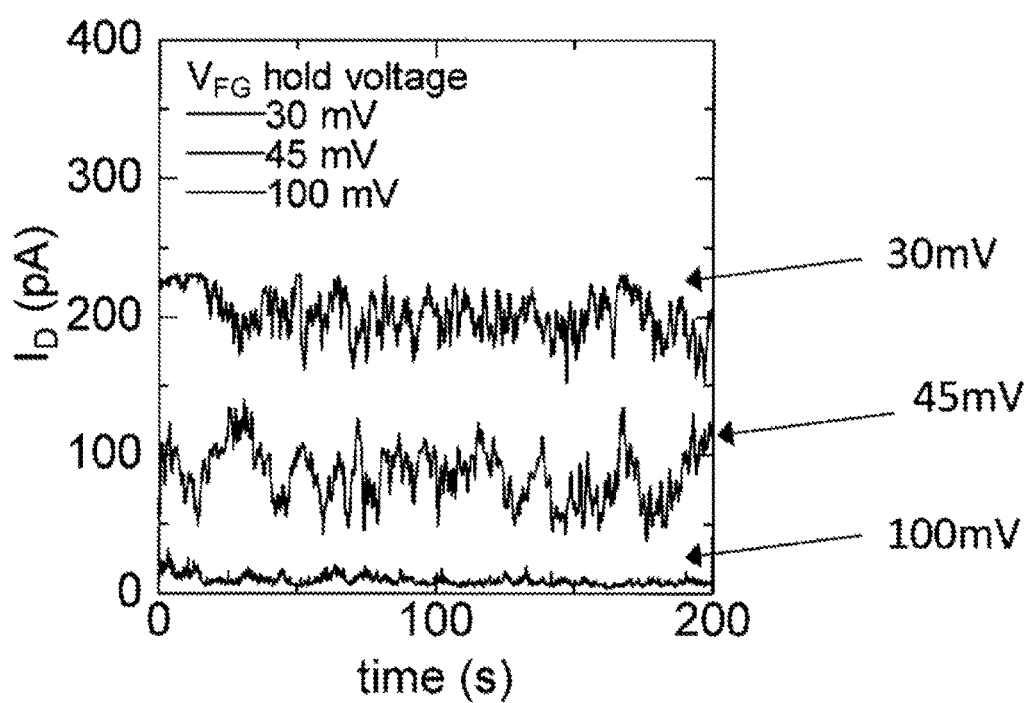
FIG. 22 is a chart showing the dependency of current on time when the charge forming voltage of the floating electrode of the nanodevice produced in Example 4 was set to 30 mV, 45 mV, and 100 mV and used as a floating gate.

It was found that when the floating electrode was used as a floating gate with the charge forming voltage set at 30 mV, 45 mV, and 100 mV, the device was found to operate as a multivalued memory taking 3-value current value when $V_{CG}$ was set to 0 V, as shown in FIG. 22. Note that this single-electron transistor exhibits peak current when $V_{FG}$=30 mV, $V_{CG}$=0 V.

It is also possible to select forming voltage of the floating gate so that the above three values are taken when the control gate voltage is 365 mV, which is equivalent to $\Delta V/2$. In other words, when the forming voltage is set at $V_{FG}$=105 mV (sum of $V_{FG}$=30 mV for generating peak current and 75 mV, which is equivalent to $\Delta V/2$), peak current is generated when $V_{CG}$=365 mV, and the current becomes off when $V_{CG}$=0 V. Similarly, when the forming voltage is set at $V_{FG}$=120 mV, 175 mV (sum of each of 45 mV and 100 mV, and 75 mV), current value equivalent to $V_{FG}$=45 mV, 100 mV in FIG. 22 can be obtained when the current value is $V_{CG}$=365 mV. Note, however, that when $V_{FG}$=175 mV, the current does not become 0 even when $V_{CG}$=0. To allow the current to be 0, drain voltage should be made to be small to allow the current to be at 0 continuously within the voltage range of $\Delta V/2$, and $V_{FG}$ that allows the current to remain 0 continuously within the range of $V_{CG}$ from 0 mV and 365 mV should be selected.

Example 5

Figure 23:
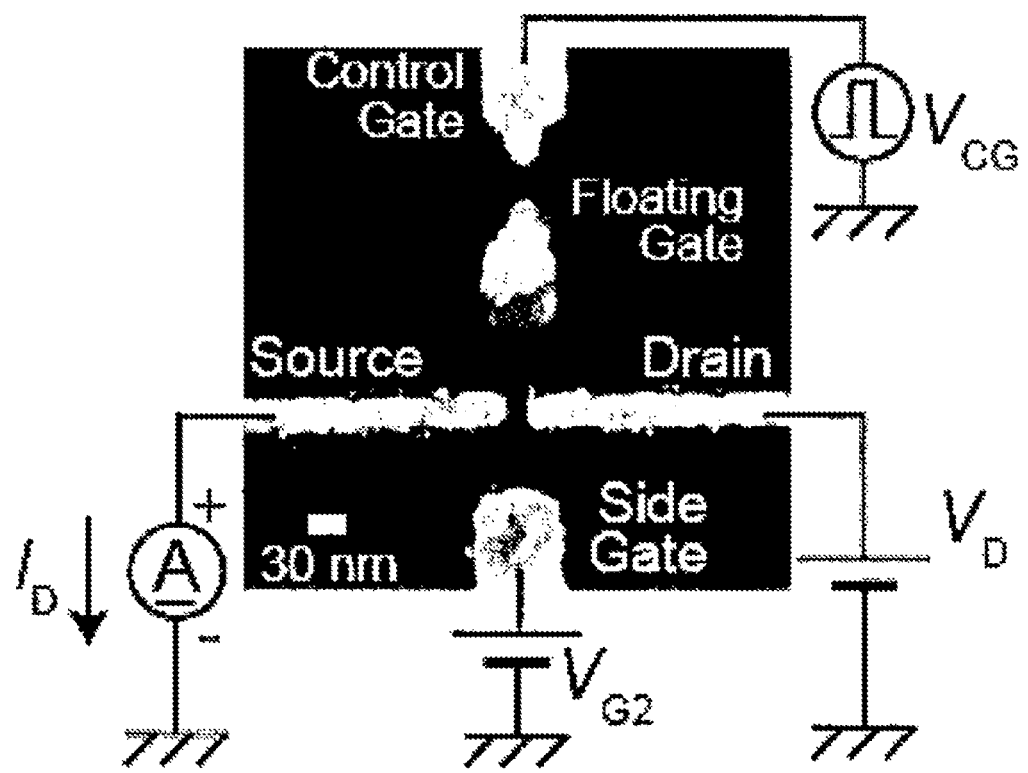
FIG. 23 is a chart showing an SEM image of the nanodevice produced in Example 5 and a measurement circuit.

As Example 5, nanodevice 20 having a control gate electrode 12 shown in FIG. 8 was produced by following the procedure shown below. On a Si substrate having a $SiO_2$ layer, an electrode structure having nanogap electrodes 5, a floating gate electrode 9B, a control gate electrode 12, and a side gate electrode 9A was produced by the electron beam lithography and electron beam deposition processes. The produced electrode structure was immersed in a 1 mM octanethiol solution prepared using ethanol as a solvent for 12 hours to produce an octanethiol self-assembled monomolecular film on the surface of the electrode structure. Then, by immersing the structure in a 1 mM decanedithiol solution prepared using ethanol as a solvent for 12 hours, a mixed self-assembled monomolecular film with octanethiol molecules partially substituted by decanedithiol molecules was produced. By immersing this sample in an Au nanoparticle solution prepared using toluene as a solvent, an Au nanoparticle was introduced between the nanogap electrodes, producing a single-electron transistor having a floating gate electrode as nanodevice 20. FIG. 23 shows an SEM image of the nanodevice produced in Example 5 as well as the measurement circuit.

This structure has a single-electron island made of a nanoparticle between the source electrode and the drain electrode, and an end of the floating gate electrode 9B, which is spatially isolated, faces the single-electron island instead of the side gate electrode. A control gate 12 faces the other end of the floating gate electrode 9B. In this SEM image, three metal nanoparticles 7 are observed in the gap, and the current flowing through the top metal nanoparticle 7 only is observed. The remaining two metal nanoparticles become Coulomb boxes as a result of quantized electros being added onto the metal nanoparticle one by one by the drain voltage and the gate voltage. Unlike the metal nanoparticle 7 that functions as a single electron island, the electric charge of these Coulomb boxes affects the offset charge of the metal nanoparticle 7 due to the capacitance between the single electron is land and the metal nanoparticle 7.

Figure 24:
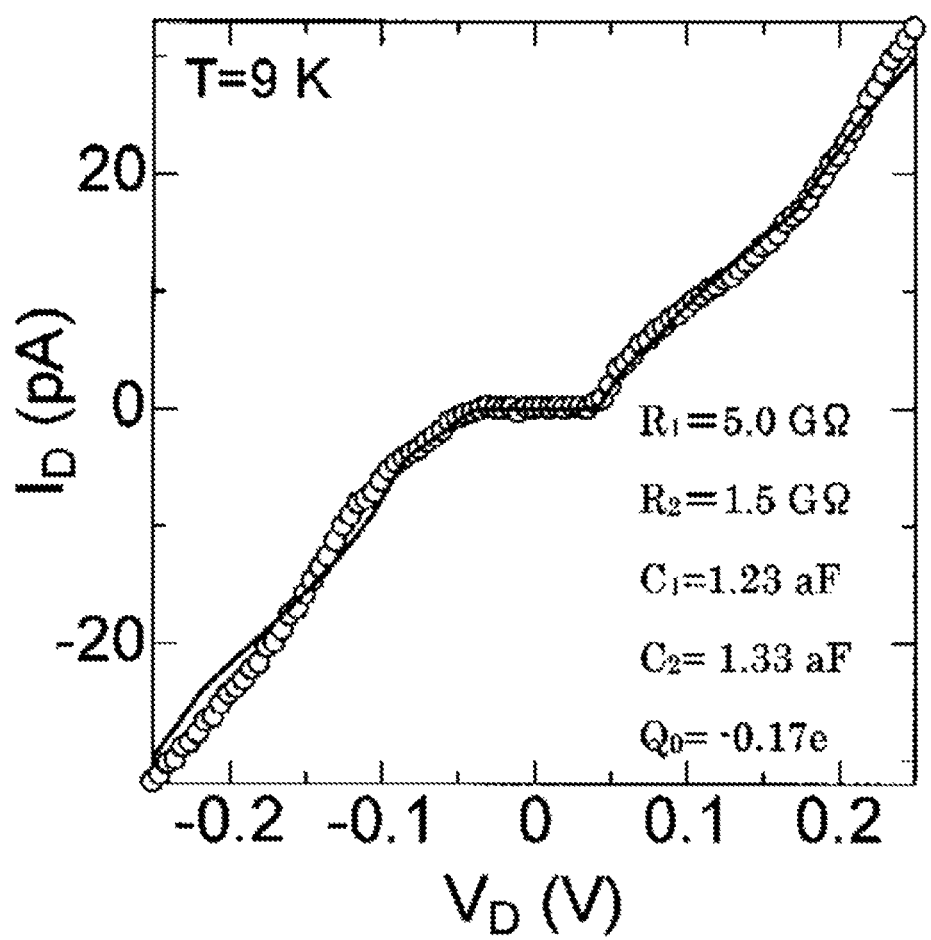
FIG. 24 is a chart showing drain current—drain voltage characteristics of the nanodevice produced in Example 5.

FIG. 24 is a chart showing the drain current—drain voltage ($I_D$-$V_D$) characteristics of the nanodevice produced in Example 5. The measurement temperature was set at 9K. A clear Coulomb blockade phenomenon, where no current is fed, is found around the drain voltage of $V_D$=0. White circle (◯) in the chart represents experimental result, and the solid line in the chart is a theoretical curve obtained by calculation performed using parameters in the chart. $R_1$, $R_2$, $C_1$, $C_2$, $Q_0$ in the chart are equivalent circuits described in Non-Patent Literature 3, showing values found by a theoretical formula of current—voltage characteristics of double tunnel coupling. The solid line represents the result of calculation of the theoretical formula performed using the above parameters. The result corresponds well to the experimental results because the produced sample is forming an ideal double tunnel coupling.

Figure 25:
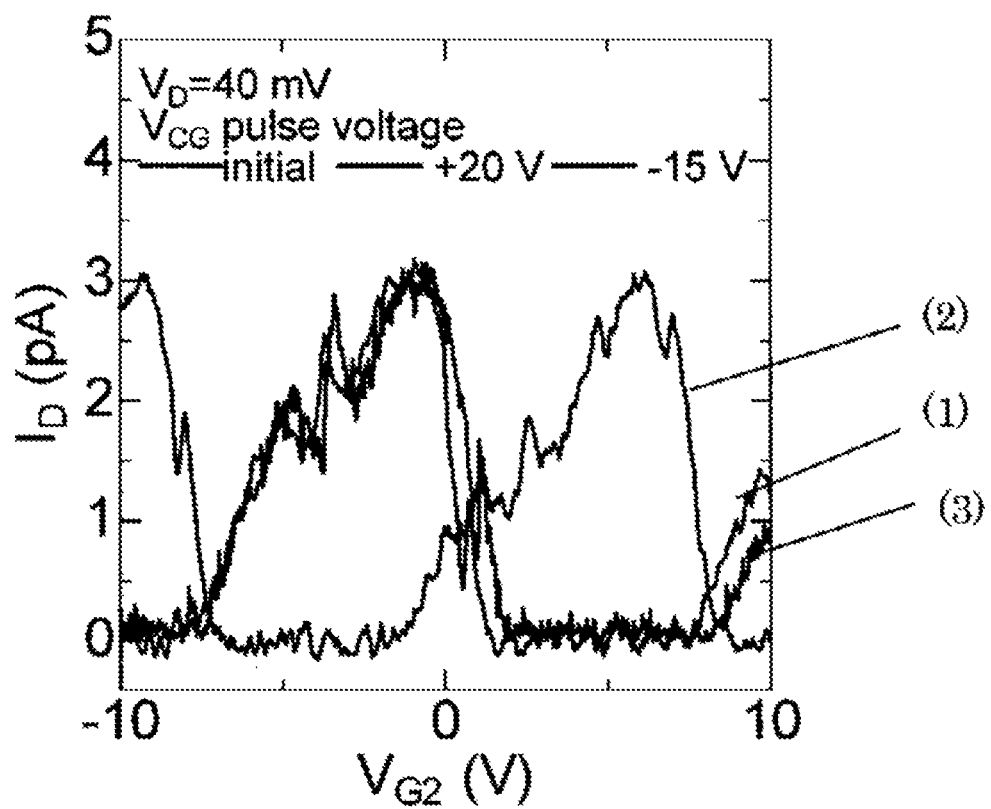
FIG. 25 is a chart showing drain current—gate voltage characteristics obtained when pulse voltage is applied to the control gate of the nanodevice produced in Example 5.

The line marked as (1) in FIG. 25 exhibits drain current—side gate voltage characteristics ($I_D$-$V_{G2}$ characteristics) obtained when side gate voltage $V_{G2}$ was swept in this single-electron transistor under the condition where drain voltage of $V_D$=40 mV was applied. A gate modulation phenomenon called Coulomb oscillation is observed. Since the voltage difference $\Delta V$ producing peak voltage due to side gate is 15 V, the side gate capacity is 10.7 zF.

Next, after setting all of the drain electrode, source electrode, side gate electrode, and Si electrode on the rear face to 0 V, +20 V was applied to the control gate electrode 12 at the pulse width of 0.5 seconds. Then after setting the control gate voltage to 0 V, $I_D$-$V_{G2}$ characteristics were measured. As shown by line (2) in FIG. 25, $I_D$-$V_{G2}$ characteristics are found to have shifted by 7V in parallel in the positive direction of the $V_{G2}$ axis. This is equivalent to the following: As a result of application of pulse voltage of +20 V to the control gate electrode 12, electric charge was induced to the floating gate electrode 9B, the electric charge was retained after the control gate voltage was set to 0 V, and the offset charge of the single-electron island changed by −0.47 e, namely e/2, where e represents elementary charge. This shift means that the electric charge of the single-electron island mostly equivalent to half cycle of $\Delta V$ has been modulated.

Next, −15 V was applied to the control gate electrode 12 at the pulse width of 0.5 seconds by following the same procedure. Then, after setting the control gate voltage to 0 V, $I_D$-$V_{G2}$ characteristics were measured. As shown by line (3) in FIG. 25, $I_D$-$V_{G2}$ characteristics are found to have shifted by 7V in parallel in the negative direction of the $V_{G2}$ axis. The $I_D$-$V_{G2}$ characteristics due to Coulomb oscillation in this state are overlapped with the $V_D$-$V_{G2}$ characteristics due to Coulomb oscillation in the initial state, which means that the electric charge of the floating gate electrode 9B has returned to the initial state, and the offset charge of the single-electron island induced by the electric charge of the floating gate has returned to the initial state.

As described above, due to the application of pulse voltage of +20 V to the control gate electrode 12, electric charge is accumulated in the floating gate electrode 9B, making it possible to shift the offset charge of the single-electron island by half of the elementary charge, and due to the application of pulse voltage of −15 V, the electric charge having been accumulated in the floating gate electrode 9B returned to the initial state, allowing the offset charge of the single-electron island to return to the initial state. Whereas the current value was 0 A in the initial state when the side gate voltage was 7 V, peak current was observed after positive pulse voltage was applied, which means that the nanodevice 20 functions as a floating gate memory, and that a rewritable circuit has been established because ON is replaced by OFF and OFF is replaced by ON.

Figure 26A:
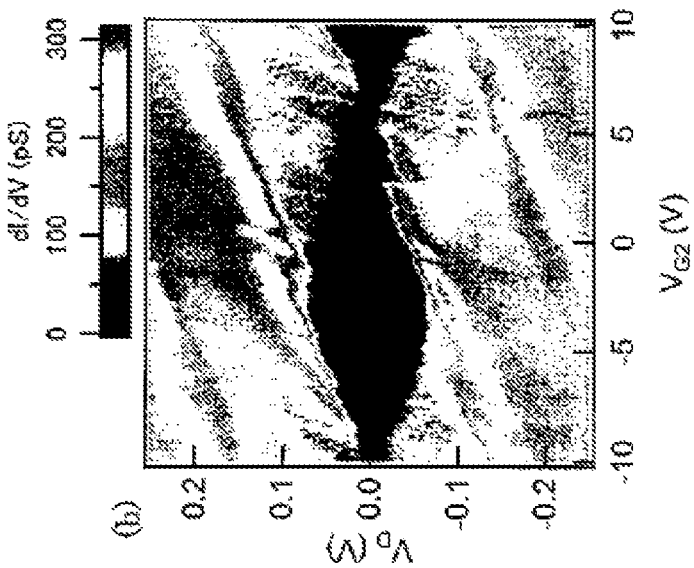
FIG. 26A is a chart obtained by plotting the differential value of the drain current on the 2-dimensional plane of drain voltage and side gate voltage in a state where electric charge is not accumulated on the floating gate of the nanodevice produced in Example 5.

FIG. 26A shows the result of plotting the differential value $dI_D/dV_D$ of the drain current on the 2-dimensional plane of the drain voltage $V_D$ and side gate voltage $V_{G2}$ ($dI_D/dV_D$-$V_D$-$V_{G2}$ plotting). A diamond shape called Coulomb diamond, which is observed in a single-electron transistor, is clearly observed.

Figure 26B:
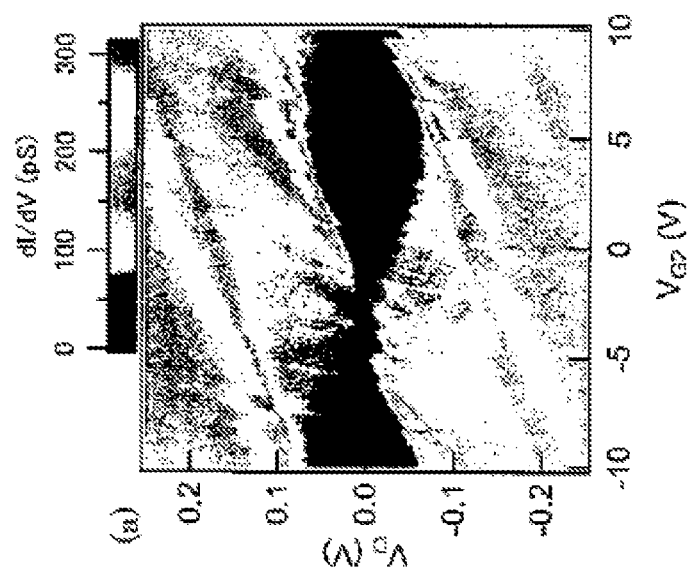
FIG. 26B is a chart obtained by plotting the differential value of the drain current on the 2-dimensional plane of drain voltage and side gate voltage after 20 V pulse is applied to the control gate.

Next, after setting all of the drain electrode, source electrode, side gate electrode, and Si electrode on the rear face to 0 V, +20 V was applied to the control gate electrode 12 at the pulse width of 0.5 seconds. Then after setting the control gate voltage to 0 V, $dI_D/dV_D$-$V_D$-$V_{G2}$ plot was measured. As a result, as shown by FIG. 26B, Coulomb diamond was found to have shifted by 7 V in parallel in the positive direction of the $V_{G2}$ axis, which corresponds to the experimental result of Coulomb oscillation. As a result of application of +20 V pulse voltage, electric charge was accumulated in the floating gate electrode, the offset charge of Au nanoparticle changed, and that state was maintained.

Since the measurement time of $dI_D/dV_D$-$V_D$-$V_{G2}$ plot was 13 hours, the electric charge induced and accumulated in the floating gate electrode is considered to be extremely stable, being retained at least 13 hours.

Figure 27:
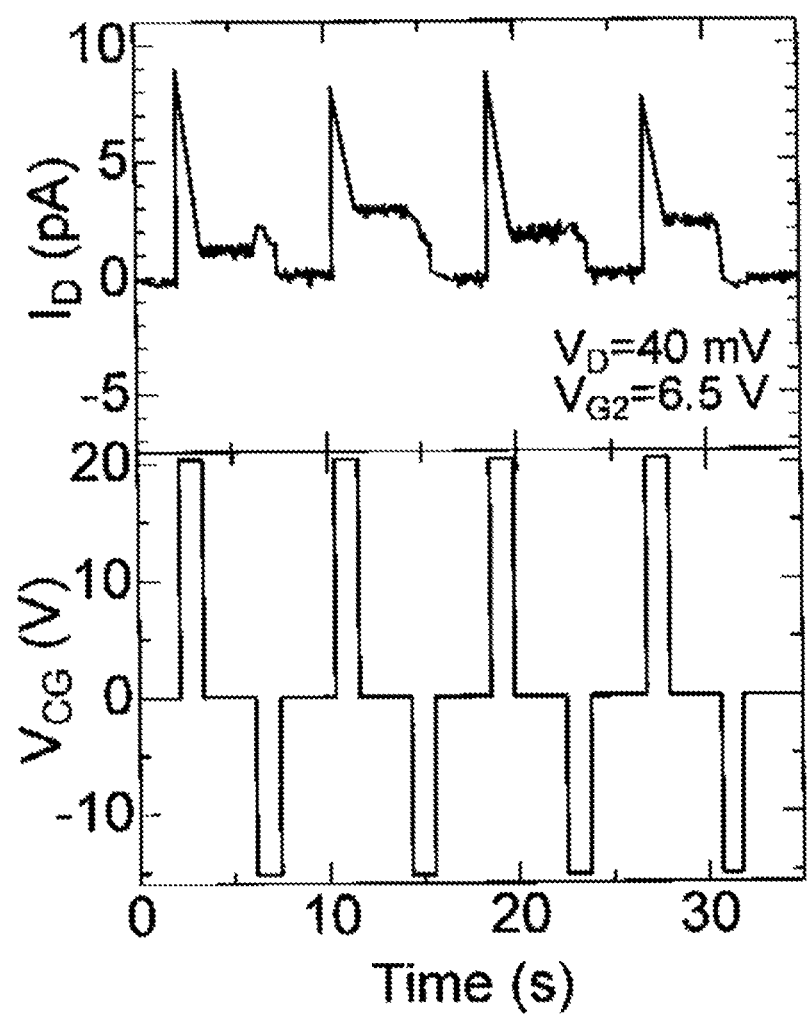
FIG. 27 is a chart showing the change in drain current in response to repetitive input of write and delete signals.

Next, under the condition where side gate voltage of $V_{G2}$=6.5 V was applied, voltage pulses of +20 V and −15 V were input to the control gate electrode 12 alternately at the pulse width of 1 second, and drain current $I_D$ immediately after the application of the voltage pulse was measured under the condition where drain voltage of $V_D$=40 mV was applied. FIG. 27 is a chart showing the change in drain current, following the repetitive input of write and delete signals. Immediately after the application of +20 V pulse, drain current $I_D$ of approximately 2 pA was observed, whereas the drain current immediately after the application of −15 V was $I_D$=0.

The single-electron memory element according to the nanodevice produced in Example 5 was thus found to be capable of writing and deleting repetitively.

With the nanodevice 20, by applying voltage pulses of +20 V and −15 V, the electric charge of the floating gate electrode 9B was made to change. Due to the difference in the structure around the floating gate, there may be a case where the electric charge of the floating gate electrode cannot be changed even when the same voltage is applied, which indicates that the conduction mechanism of the floating gate that induces conduction has non-linear property, and that conduction may not occur due to difference in electric field intensity of the part where conduction is expected to occur due to slight structural difference. In such a case, it is possible to allow the device to operate by applying a larger pulse voltage.

The nanodevice 20 in Example 5 operates at 9K. To allow the device to operate at room temperatures, the core particle diameter of the metal nanoparticle 7 must be made smaller to allow a Coulomb blockade phenomenon to occur stably at room temperatures.

The embodiments and examples of the present invention used a metal nanoparticle, but semiconductor nanoparticles/molecules, etc. are also applicable.

What is claimed is:

1. A nanodevice comprising:
nanogap electrodes comprising a first electrode and a second electrode so as to have a nanosized gap in between;
a nanoparticle disposed between the nanogap electrodes;
one or more gate electrodes, each of the one or more gate electrodes connected to a wire so as to apply an input voltage;
a floating gate electrode;
a control gate electrode to control a state of electric charge of the floating gate electrode;
a first insulating layer on which the nanogap electrodes and the floating gate electrode are disposed; and
a second insulating layer disposed on the first insulating layer, the nanogap electrodes, the floating gate electrode, and the nanoparticle,
wherein the control gate electrode is disposed on the first insulating layer, and
the control gate electrode is disposed on an opposite side to the nanoparticle with the floating gate electrode interposed therebetween, or
wherein the control gate electrode is disposed on the second insulating layer and above the floating gate electrode, and
wherein the one or more gate electrodes do not include the floating gate electrode and the control gate electrode.

2. The nanodevice as set forth in claim 1,
wherein the one or more gate electrodes comprise any one of a side gate electrode, a top gate electrode, and a bottom gate electrode, and a combination thereof,
wherein the side gate electrode is disposed on the first insulating layer, the side gate electrode is disposed on an opposite side of the floating gate electrode with the nanoparticle interposed therebetween,
the top gate electrode is disposed on the second insulating layer and above the nanoparticle, and
the bottom gate electrode is disposed under the first insulating layer and below the nanoparticle.

3. A nanodevice comprising:
nanogap electrodes comprising a first electrode and a second electrode so as to have a nanosized gap in between;
a nanoparticle disposed between the nanogap electrodes;
one or more gate electrodes, each of the one or more gate electrodes connected to a wire so as to apply an input voltage;
a floating gate electrode;
a control gate electrode to control a state of electric charge of the floating gate electrode;
a first insulating layer on which the nanogap electrodes are disposed; and
a second insulating layer disposed on the first insulating layer, the nanogap electrodes, and the nanoparticle,
wherein the floating gate electrode is disposed on the second insulting layer and above the nanoparticle,
the nanodevice comprises a third insulating layer on which the second insulating layer and the floating gate electrode are disposed,
the control gate electrode is disposed on the third insulating layer, and
the control gate electrode is disposed above the floating gate electrode, and
wherein the one or more gate electrodes do not include the floating gate electrode and the control gate electrode.

4. The nanodevice as set forth in claim 3,
wherein the one or more gate electrodes comprise any one of a side gate electrode, and a bottom gate electrode, and a combination thereof,
the side gate electrode is disposed on the first insulating layer and arranged in a direction crossing an arrangement direction of the nanogap electrodes,
an edge of the side gate electrode faces the nanoparticle, and
the bottom gate electrode is disposed under the first insulating layer and below the nanoparticle.

5. A nanodevice comprising:

nanogap electrodes comprising a first electrode and a second electrode so as to have a nanosized gap in between;

a nanoparticle disposed between the nanogap electrodes;

one or more gate electrodes, each of the one or more gate electrodes connected to a wire so as to apply an input voltage;

a floating gate electrode;

a control gate electrode to control a state of electric charge of the floating gate electrode;

a first insulating layer on which the nanogap electrodes are disposed; and a second insulating layer disposed on the first insulating layer, the nanogap electrodes, and the nanoparticle, wherein the floating gate electrode is disposed on the second insulting layer and above the nanoparticle, and the control gate electrode is disposed on the second insulating layer, and arranged beside a floating gate electrode, and wherein the one or more gate electrodes do not include the floating gate electrode and the control gate electrode.

6. The nanodevice as set forth in claim 5, wherein the one or more gate electrodes comprise any one of one or two side gate electrodes, and a bottom gate electrode, and a combination thereof, any one of the one or two side gate electrodes is disposed on the first insulating layer and arranged in a direction crossing an arrangement direction of the nanogap electrodes, an edge of any one of the one or two side gate electrodes faces the nanoparticle, and the bottom gate electrode is disposed under the first insulating layer and below the nanoparticle.

* * * * *